(12) United States Patent
Jaiprakash et al.

(10) Patent No.: US 7,015,145 B2
(45) Date of Patent: Mar. 21, 2006

(54) SELF-ALIGNED COLLAR AND STRAP FORMATION FOR SEMICONDUCTOR DEVICES

(75) Inventors: Venkatachalam C. Jaiprakash, Beacon, NY (US); Norbert Arnold, Chestnut Ridge, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/756,415

(22) Filed: Jan. 8, 2001

(65) Prior Publication Data

US 2002/0090824 A1 Jul. 11, 2002

(51) Int. Cl.
 *H01L 21/311* (2006.01)

(52) U.S. Cl. .................. 438/700; 438/702; 438/706
(58) Field of Classification Search ............. 438/239, 438/243, 244, 246, 247, 700, 702, 706
See application file for complete search history.

(56) References Cited

U.S. PATENT DOCUMENTS

| | | | | |
|---|---|---|---|---|
| 5,981,332 A | * | 11/1999 | Mandelman et al. | 438/242 |
| 6,018,174 A | | 1/2000 | Schrems et al. | 257/296 |
| 6,063,657 A | * | 5/2000 | Bronner et al. | 438/243 |
| 6,110,792 A | * | 8/2000 | Bronner et al. | 438/386 |
| 6,184,107 B1 | * | 2/2001 | Divakaruni et al. | 438/243 |
| 6,297,089 B1 | * | 10/2001 | Coronel et al. | 438/244 |

* cited by examiner

*Primary Examiner*—Benjamin L. Utech
*Assistant Examiner*—Kin-Chan Chen
(74) *Attorney, Agent, or Firm*—Slater & Matsil, L.L.P.

(57) ABSTRACT

A method for fabricating a buried strap forms a dielectric collar along sidewalls of a trench. The trench is formed in a substrate. The trench is filled with a conductive material and the conductive material is recessed in the trench to expose a portion of the collar. A masking layer is deposited in the trench over the exposed portion of the collar. A portion of the masking layer is removed over one side of the collar and a portion of the collar is etched on the one side. A buried strap is formed on the conductive material, which connects to the substrate on the one side.

16 Claims, 24 Drawing Sheets

SELF-ALIGNED COLLAR AND STRAP FORMATION FOR SEMICONDUCTOR DEVICES

BACKGROUND

1. Technical Field

This disclosure relates to semiconductor fabrication, and more particularly, to methods for forming a single sided buried strap on one side of the trench while protecting a collar dielectric on the other side of the trench.

2. Description of the Related Art

To reduce memory cell size and increase the density of devices formed on a semiconductor chip, vertical transistors have been developed. Memory devices, such as dynamic random access memories (DRAM) may include vertical transistors. Vertical transistors are formed by providing a trench in a substrate and forming a dielectric collar on sidewalls of the trench. A storage node is formed in the trench and recessed to provide access to substrate walls. A buried strap is formed in the recess by depositing a highly doped material in the trench. For vertical transistors, a single side buried strap may be employed. This single-sided strap is formed by methods, which may cause damage to the collar on the opposite side of the trench. In these cases, the collar would not provide adequate protection from the adjacent device.

Therefore, a need exists for a fabrication method which removes a portion of a dielectric collar to form a single-sided buried strap without damage to portions of the collar, which are to remain in the trench.

SUMMARY OF THE INVENTION

A method for fabricating a buried strap forms a dielectric collar along sidewalls of a trench. The trench is formed in a substrate. The trench is filled with a conductive material and the conductive material is recessed in the trench to expose a portion of the collar. A masking layer is deposited in the trench over the exposed portion of the collar. A portion of the masking layer is removed over one side of the collar and a portion of the collar is etched on the one side. A buried strap is formed on the conductive material, which connects to the substrate on the one side.

In other methods, the masking layer preferably includes nitride. The step of removing a portion of the masking layer may include patterning a cut mask for etching the masking layer. The step of removing a portion of the masking layer may include the steps of forming a polysilicon layer over the trench, doping and oxidizing the polysilicon layer in predetermined areas, removing the polysilicon layer in other than the predetermined areas and etching the masking layer the in accordance with the predetermined areas. The may further includes the step of forming isolation trenches in communication with the trench. The method may include the steps of oxidizing surfaces within the isolation trenches, lining the isolation trenches with a nitride layer, filling the isolation trenches with a dielectric material. The method may further include the steps of protecting portions of the nitride layer in communication with the trench during the step of removing a portion of the masking layer by employing surfaces oxidized in the step of oxidizing surfaces. The step of oxidizing surfaces may include forming an oxide between about 70 angstroms to about 90 angstroms in thickness. The step of forming a buried strap may include the steps of depositing a buried strap conductor in the trench and etching back the buried strap conductor.

A method for fabricating a one-sided buried strap, includes the steps of forming a dielectric collar along sidewalls of a trench, the trench formed in a substrate, filling the trench with a conductive material, etching isolation trenches in communication with the trench, oxidizing surfaces within the isolation trenches, lining the isolation trenches with a nitride layer, filling the isolation trenches with a dielectric material, recessing the conductive material in the trench to expose a portion of the collar, depositing a masking layer in the trench over the exposed portion of the collar, removing a portion of the masking layer over one side of the collar, etching a portion of the collar on the one side and forming a buried strap on the one side.

In alternate embodiments, the masking layer may include nitride. The step of removing a portion of the masking layer may include patterning a cut mask for etching the masking layer. The step of removing a portion of the masking layer may include the steps of forming a polysilicon layer over the trench, doping and oxidizing the polysilicon layer in predetermined areas, removing the polysilicon layer in other than the predetermined areas and etching the masking layer the in accordance with the predetermined areas. The method may include the steps of protecting portions of the nitride layer in communication with the trench during the step of removing a portion of the masking layer by employing surfaces oxidized in the step of oxidizing surfaces. The step of oxidizing surfaces may include forming an oxide between about 70 angstroms to about 90 angstroms in thickness. The step of forming a buried strap may include the steps of depositing a buried strap conductor in the trench and etching back the buried strap conductor.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides methods for fabricating memory cells with vertical transistors. The present invention relates, in particular to the removal of a portion of a dielectric collar without damaging other portions of the dielectric collar in a deep trench structure. The methods of the present invention provide at least the following features: protects the collar while forming a buried strap, ensures that the collar width is equal to an active area width, reduces/eliminates dependence of isolation regions on active area-to-deep trench overlay, eliminates the need for an additional active area pad nitride layer for patterning the active area and reduces process complexity.

The present invention confines the buried strap in a lateral dimension by a self-aligned strap formation process. In devices which need a strap on one side of the trench, the present invention permits for the formation of the buried strap on the one side while protecting a collar formed in the trench on the other side. These features will become apparent by the following description of the present invention. The structures and materials employed herein are for purposes of illustratively describing the present invention. These illustrative examples, may be modified or changed within the scope of the present invention.

Figure 1:
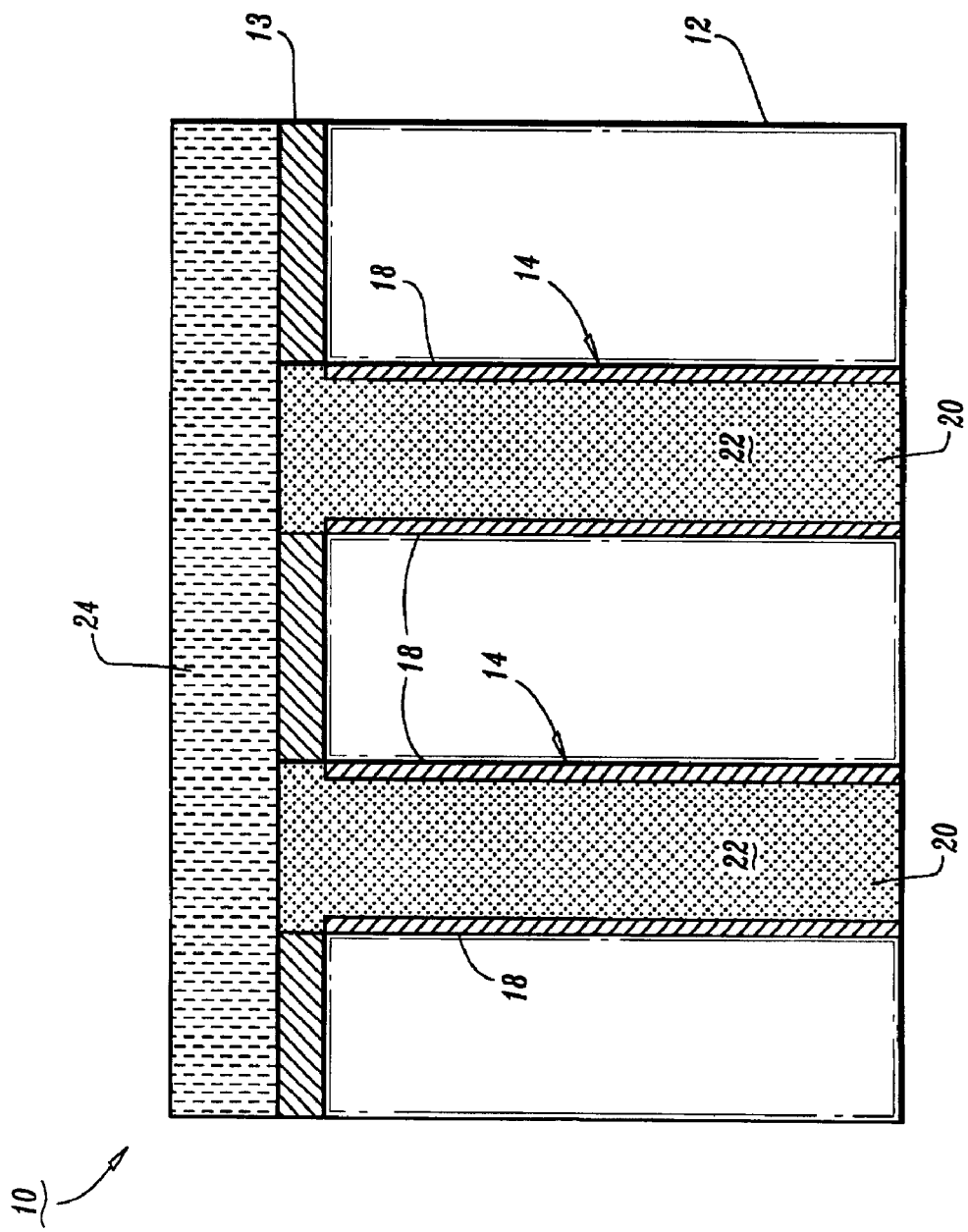
FIG. 1 is a schematic diagram showing a cross-sectional view of a semiconductor device showing deep trenches and an isolation mask formed in accordance with the present invention.

Referring now in specific detail to the drawings in which like reference numerals identify similar or identical elements throughout the several views, and initially to FIG. 1, a cross-sectional view of a semiconductor device 10 is shown. Semiconductor device 10 preferably includes a dynamic random access memory (DRAM), although the present invention is applicable to any memory device having vertical transistors and a trench capacitor. Semiconductor device 10 includes a substrate 12, for example, a monocrystalline silicon substrate. A pad dielectric layer 13 (e.g., a pad nitride layer and a pad oxide layer) is formed on a surface of substrate 12. Trenches 14 (e.g., deep trenches (DT)) are formed in substrate 12 by patterning a hardmask layer (not shown) and etching pad dielectric layer 13 and substrate 12. A buried plate (not shown) is formed in a lower portion of trench 14 by doping substrate 12 at a lower portion of trenches 16, as is known in the art.

A dielectric collar 18 is formed in trench 14. Collar 18 preferably includes a silicon oxide formed by, for example, a TEOS deposition or a LOCOS process, and node formation prior to or after the collar, as is known in the art. Trench 16 is filled with a conductive material 20, such as, doped polysilicon, to form a storage node 22. Material 20 is removed from a top surface of pad dielectric layer 14 by a planarization process (e.g., chemical-mechanical polishing (CMP).

Figure 2:
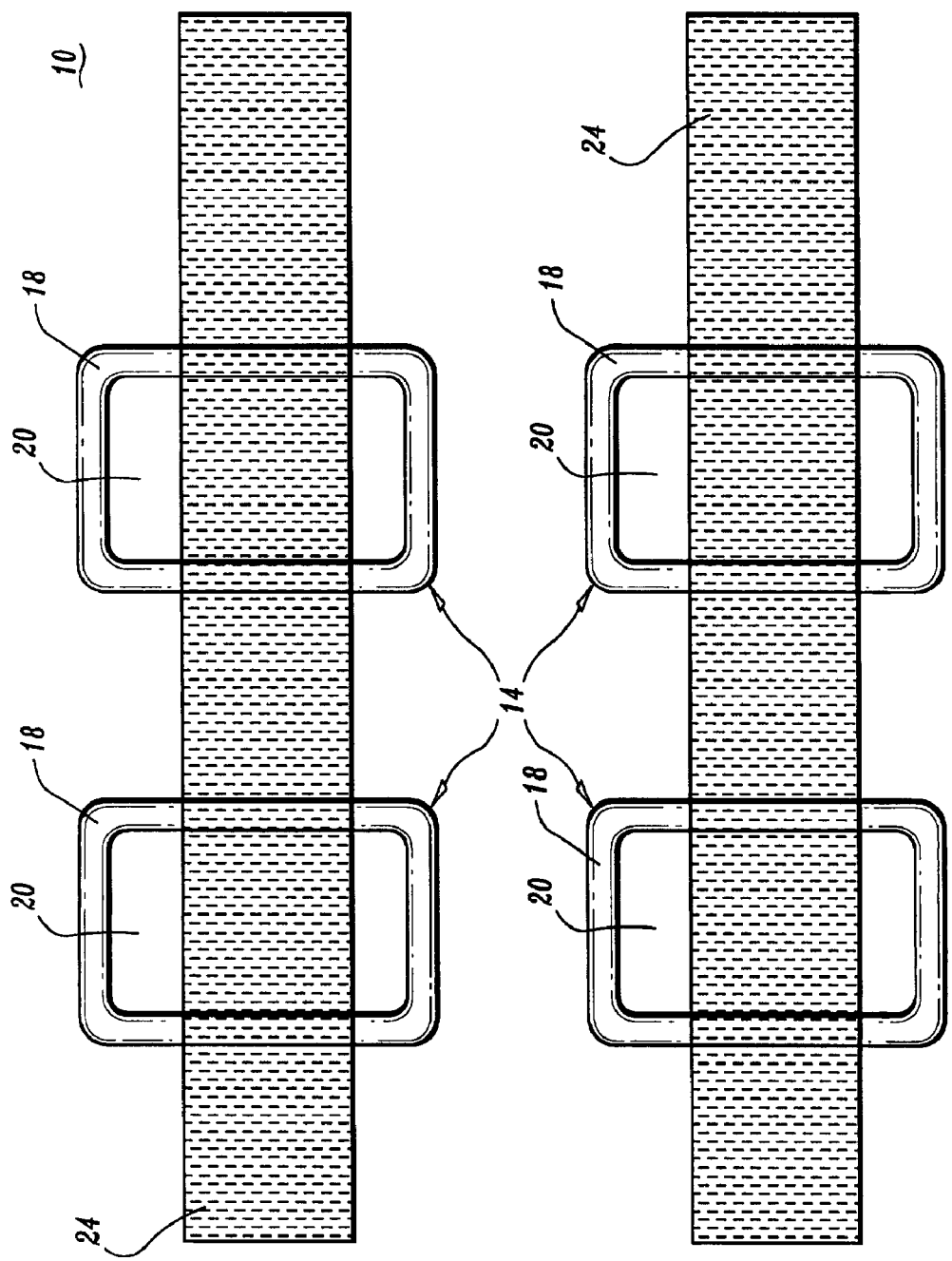
FIG. 2 is a top view illustratively showing deep trenches with an isolation trench mask overlaid in accordance with the present invention.

An isolation trench hardmask 24 is deposited and lithographically patterned to provide an etch mask for the formation of isolation trenches. As shown in FIG. 2, a top view of device 10 shows the lithographically patterned hardmask 24 relative to trenches 14. Trenches 14 include collar 18 and material 20 therein. Isolation trenches 26 (FIG. 4) are formed by performing a trench etch process, such as, a reactive ion etch (RIE). Hardmask 24 is then removed as shown in FIG. 3.

Figure 3:
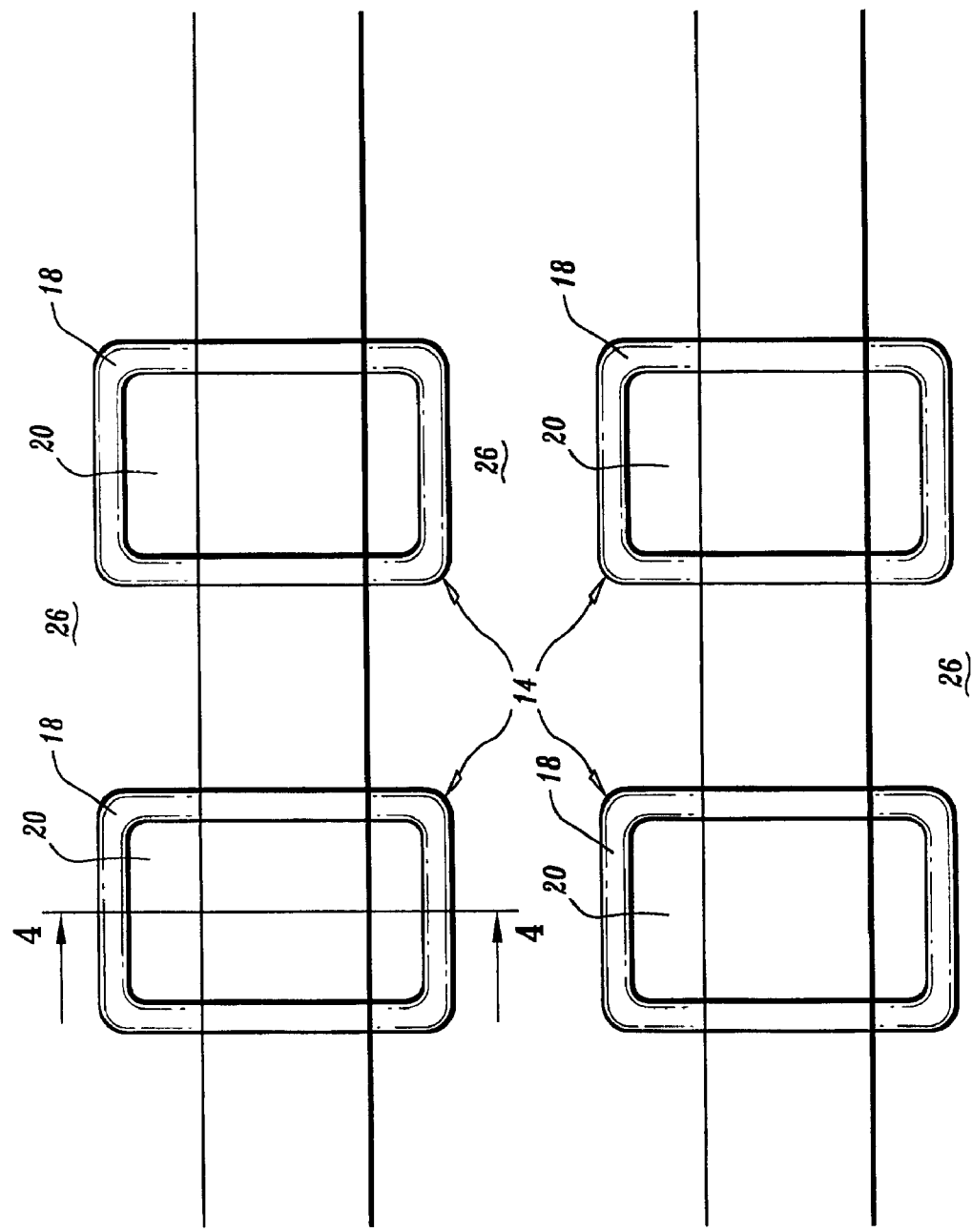
FIG. 3 is a top view of the semiconductor device of FIG. 3 after isolation trenches have been etched and the isolation trench mask removed in accordance with the present invention.
Figure 4:
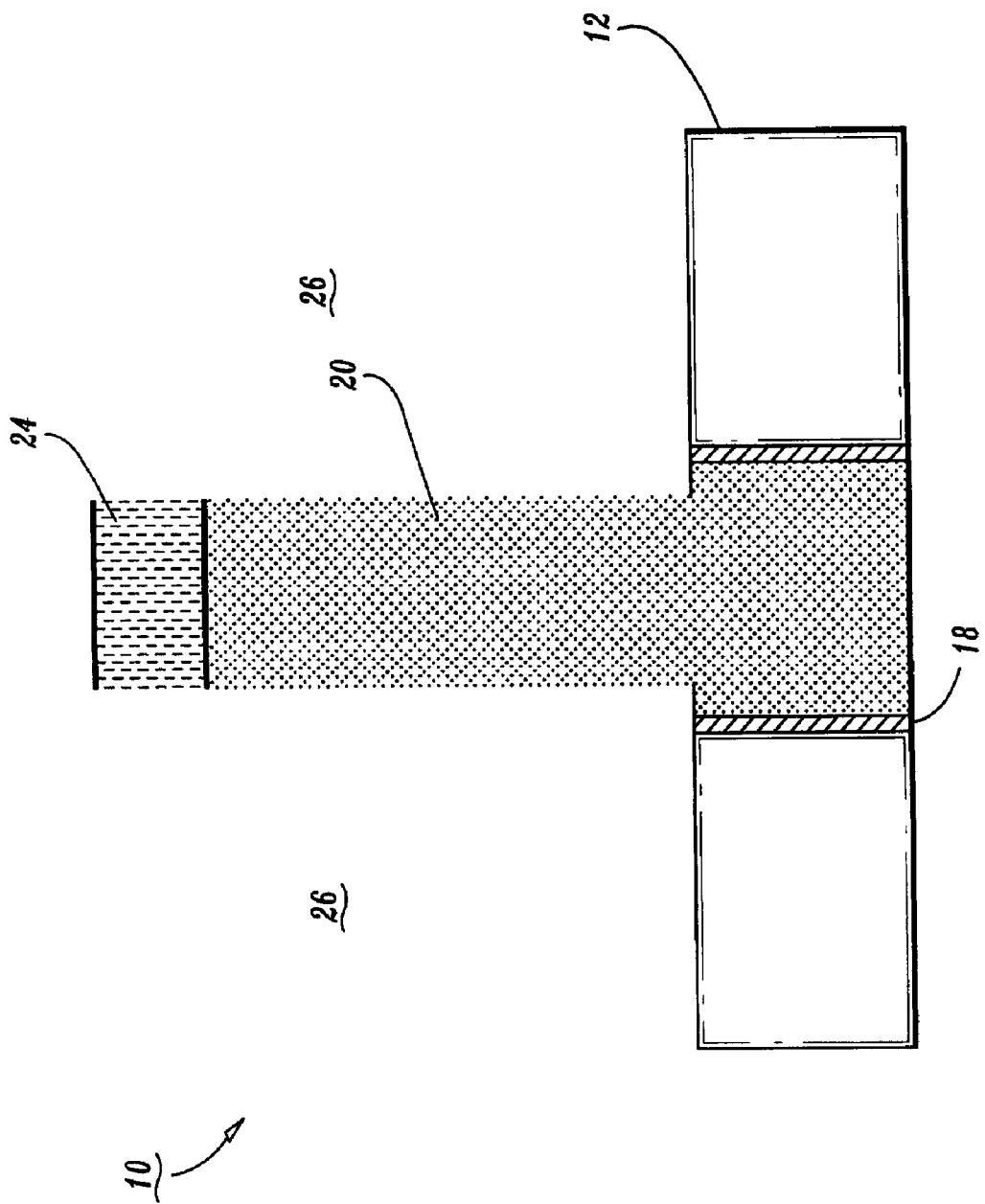
FIG. 4 is a cross-sectional view of the semiconductor device of FIG. 3 taken at section line 4—4 of FIG. 3 in accordance with the present invention.
Figure 5:
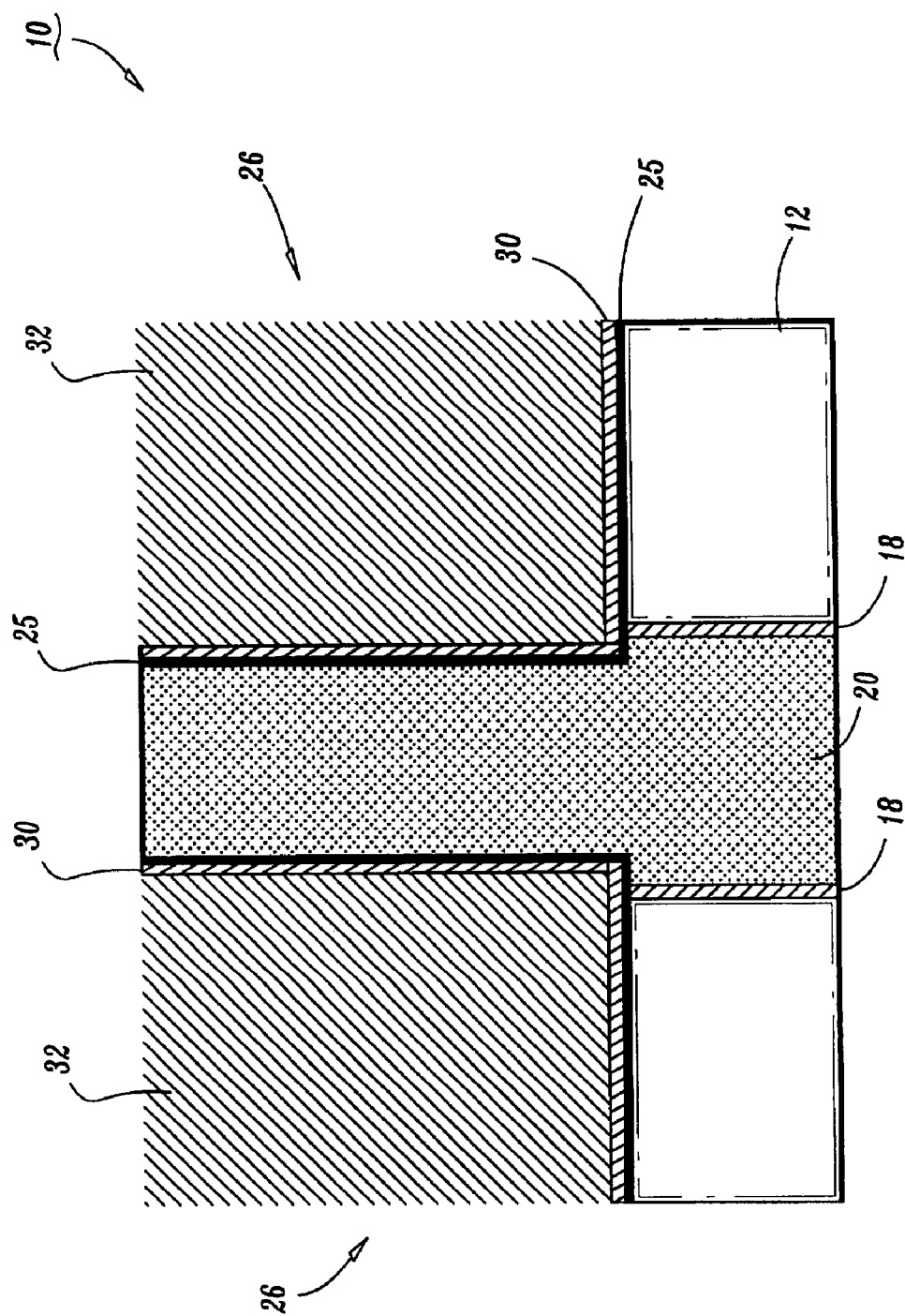
FIG. 5 is a cross-sectional view of the semiconductor device of FIG. 4 after isolation regions are formed in accordance with the present invention.

Referring to FIG. 4, a cross-section taken at section line 4—4 of FIG. 3 is shown, after etching isolation trenches 26. FIG. 5 shows the same section as FIG. 4 after hardmask 24 is removed and an oxidation process is performed to form an oxide on exposed surfaces of substrate 12 and material 20, which forms an oxidation layer 25. This oxidation layer 25 will be employed in later steps to protect a thin dielectric layer 30 from being etched from inside of trench 14. Dielectric layer 30 is conformally deposited on the walls and bottom of trenches 26 over oxidation layer 25. Dielectric layer 30 preferably includes a nitride. Trenches 26 are filled with a dielectric material, such as a high density plasma (HDP) oxide or the like to form shallow or intermediate trench isolation regions 32 (STI or IT, respectively). A CMP or other planarizing process is employed to planarize the top surface of device 10.

Figure 6:
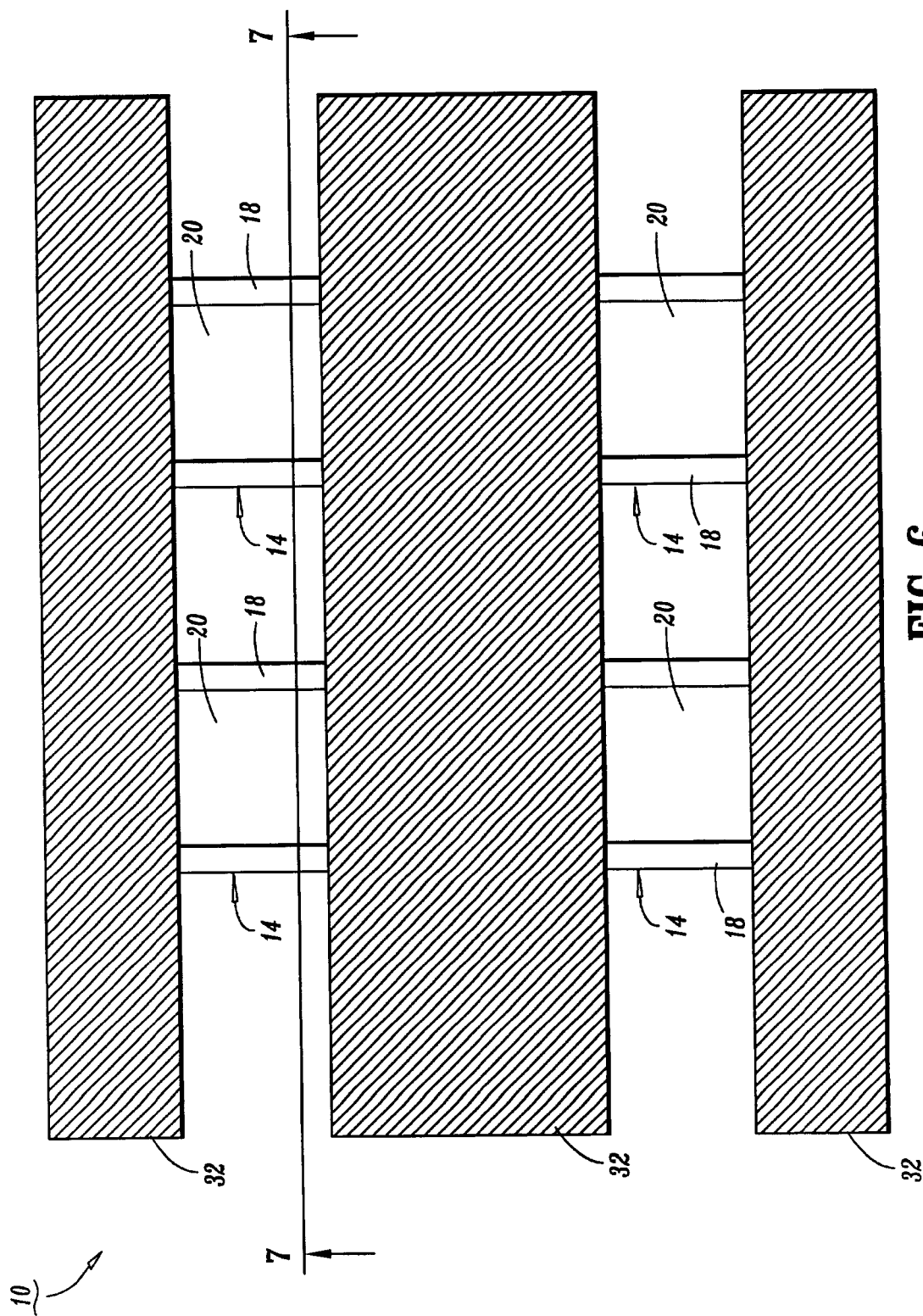
FIG. 6 is a top view of the semiconductor device of FIG. 5 in accordance with the present invention.
Figure 7:
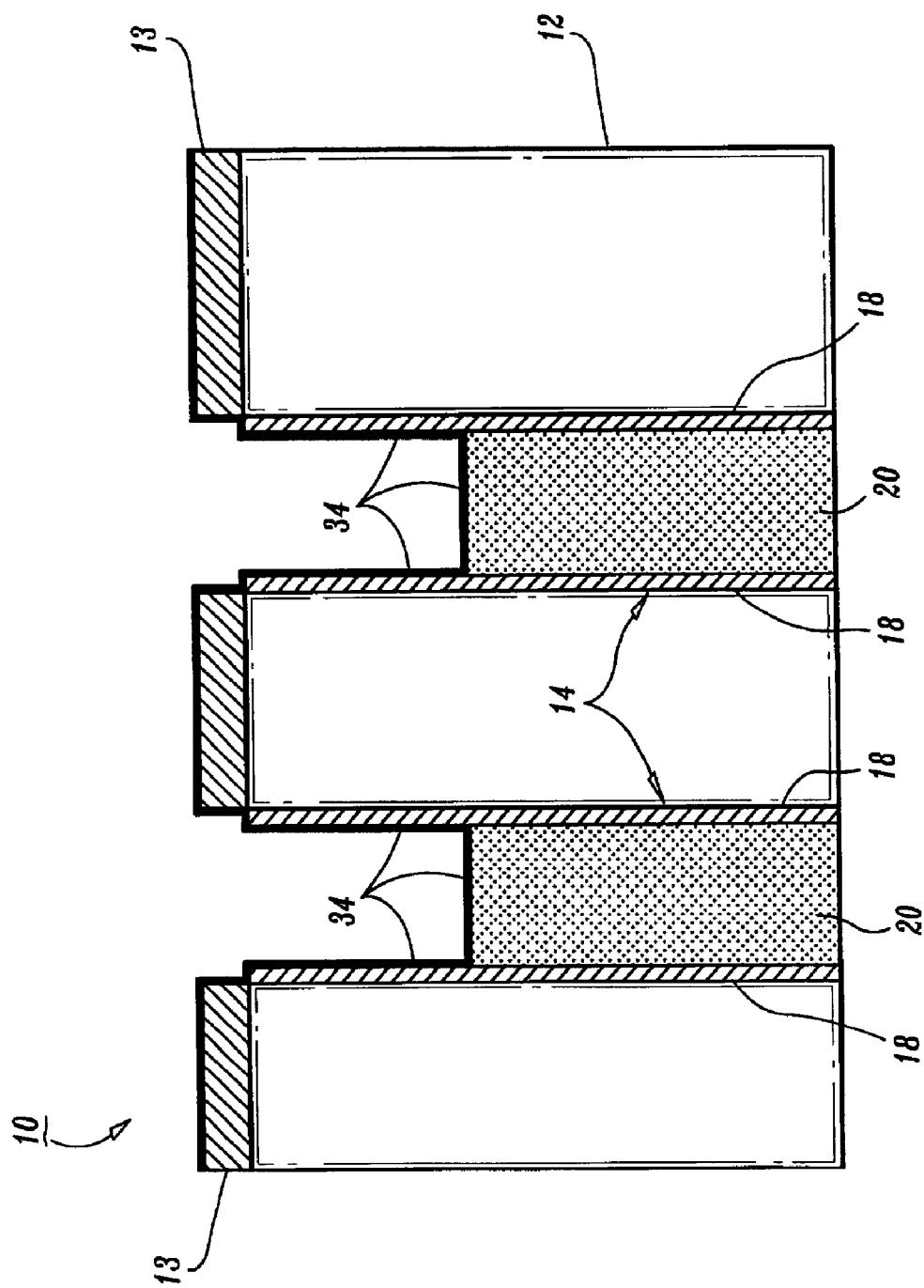
FIG. 7 is a cross-sectional view of the semiconductor taken at section line 7—7 of FIG. 6 showing a dielectric layer deposited in the deep trenches in accordance with the present invention.

FIG. 6 is top view of device 10 after isolation regions 32 are filled. FIG. 7 is a cross-section taken at section line 7—7 of FIG. 6. Referring to FIG. 7, material 20 is recessed into trenches 14 by an anisotropic etching process. A thin dielectric layer 34 having a thickness of, for example, between about 2–5 nm is deposited. Dielectric layer 34 preferably includes a nitride layer.

Figure 8:
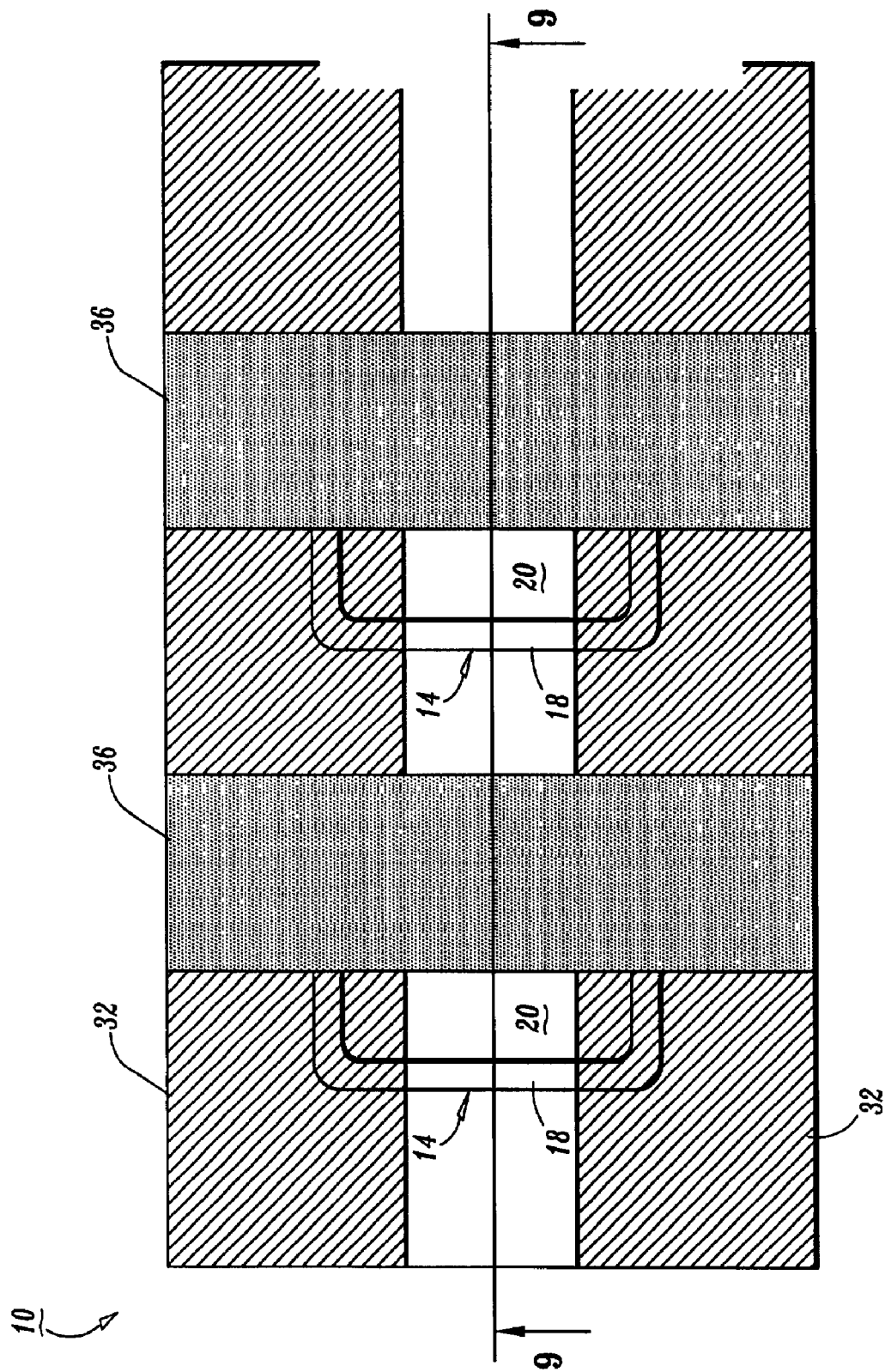
FIG. 8 is a top view of the semiconductor device of FIG. 7 after patterning a cut mask in accordance with the present invention.

Referring to FIG. 8, a top view of device 10 is shown after a cut mask 36 is deposited and patterned. Cut mask 36 may include a silicate glass, such as borophosphosilicate glass (BPSG), other oxides, photoresists or any other material which can be used to fill trench 14, form an etch mask and permit dielectric layer 34 to be patterned by an etch process. Cut mask 36 is deposited, lithographically patterned (e.g., by employing a patterned resist layer, and reactive ion etching cut mask 36 to obtain the appropriate pattern).

Figure 9:
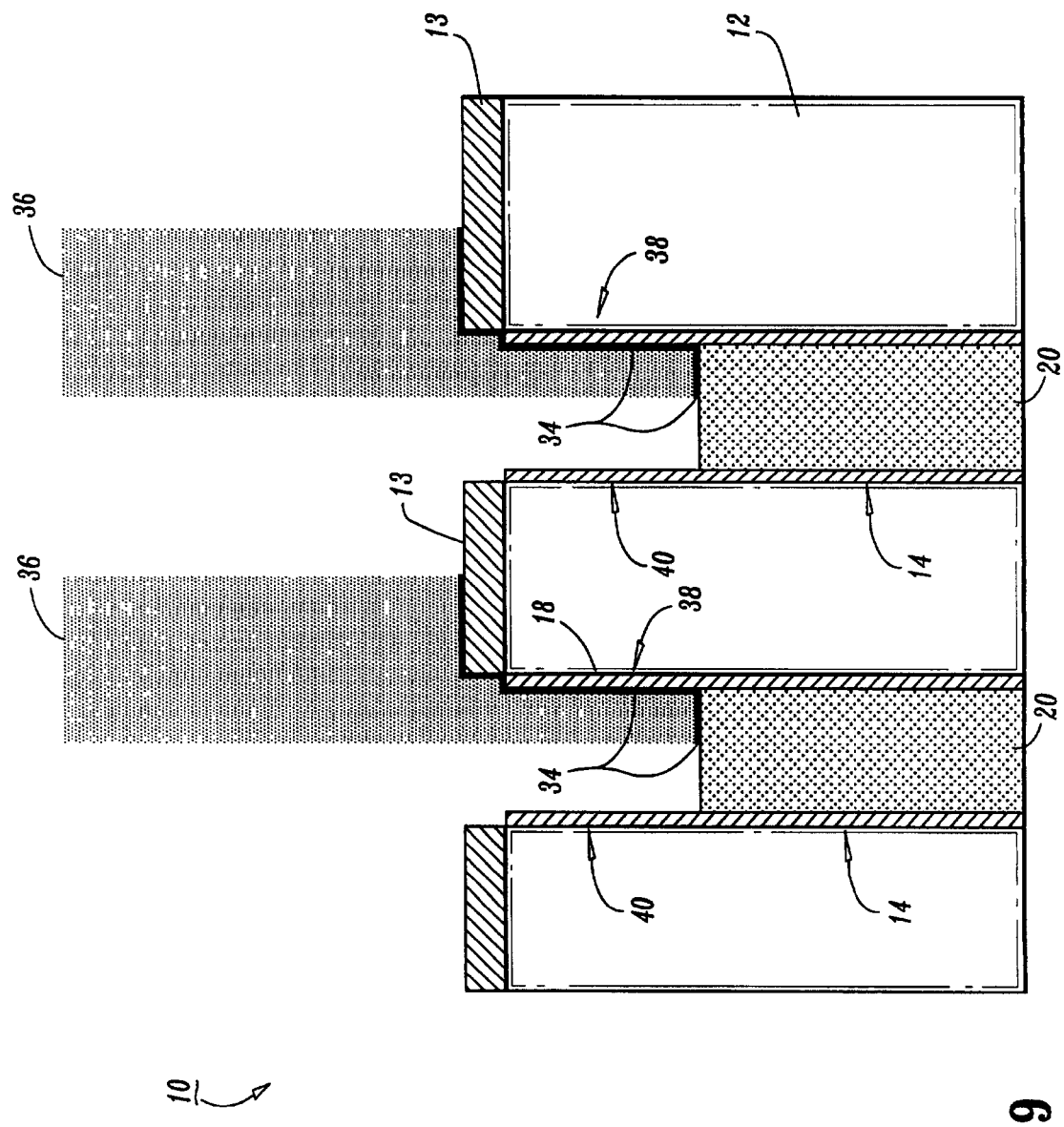
FIG. 9 is a cross-sectional view of the semiconductor taken at section line 9—9 of FIG. 8 showing the dielectric layer patterned in the deep trenches in accordance with the present invention.

Referring to FIG. 9, a cross-sectional view taken at section line 9—9 of FIG. 8 is shown. Cut mask 36 protects dielectric layer 34 on the side 38 where collar 18 is to be preserved, and cut mask 36 leaves dielectric layer 34 exposed on a side 40 where a single sided buried strap is to be formed. Dielectric layer 34 is stripped in areas where it is left exposed by cut mask 36, as shown in FIG. 9.

Figure 10:
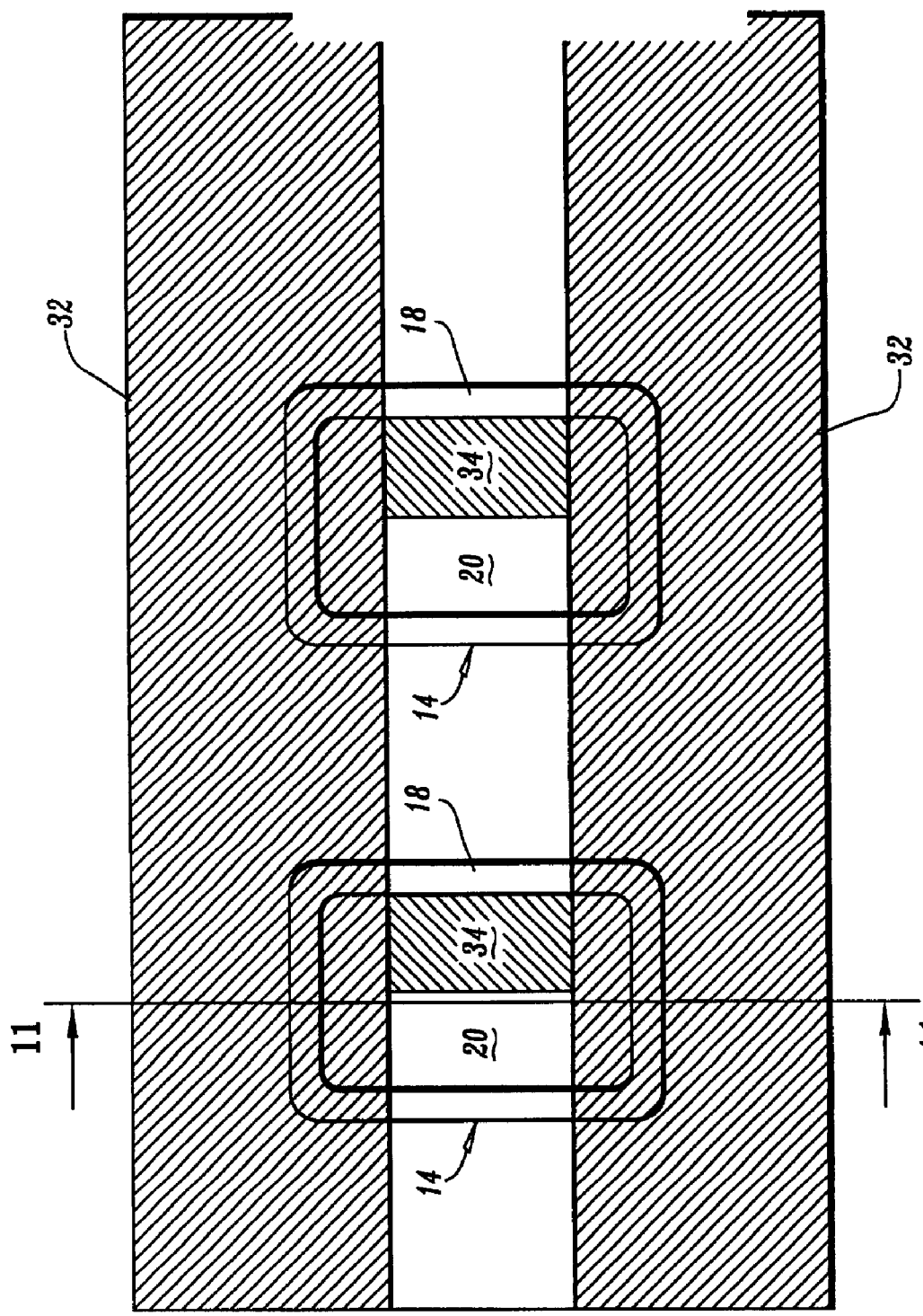
FIG. 10 is a top view of the semiconductor device of FIG. 9 after the cut mask is removed in accordance with the present invention.
Figure 11:
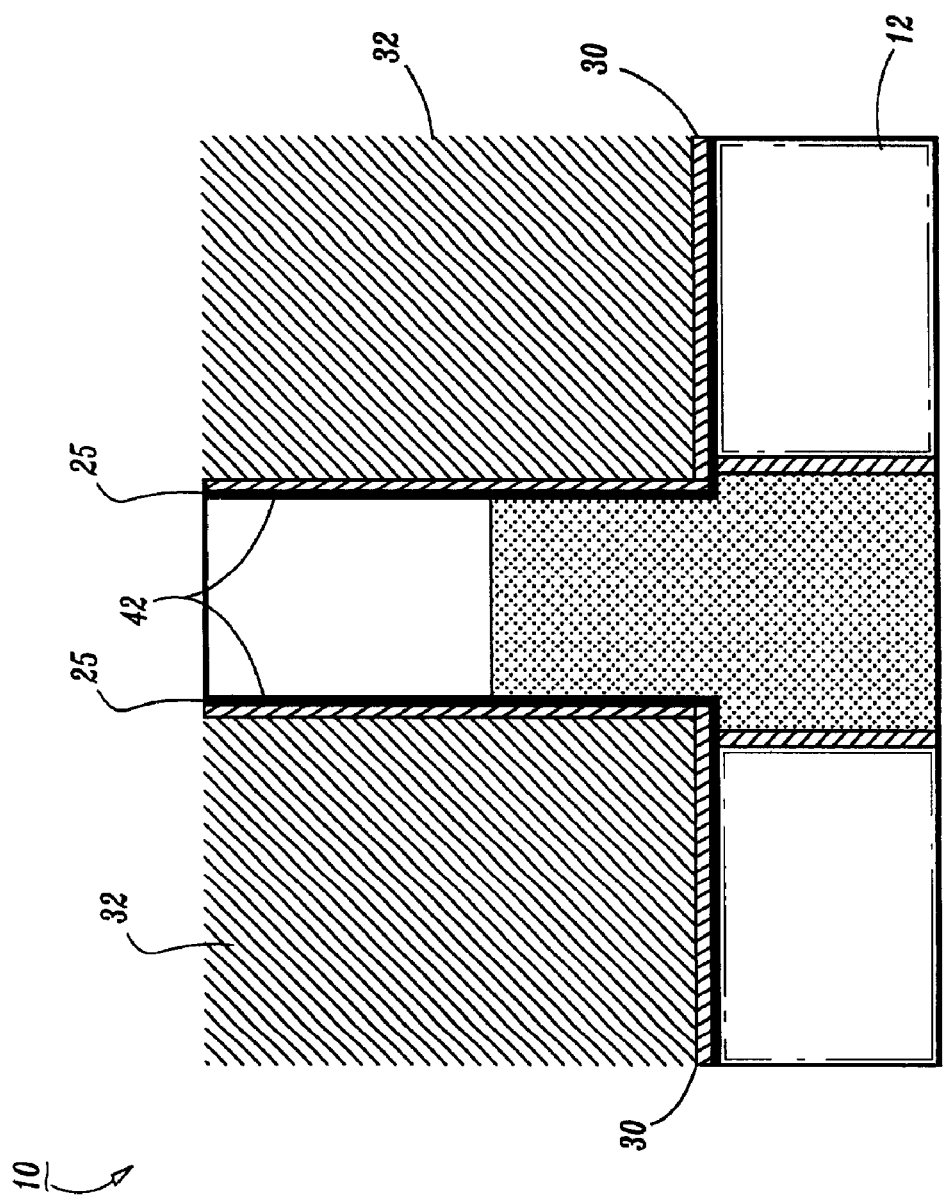
FIG. 11 is a cross-sectional view of the semiconductor device taken at section line 11—11 of FIG. 10 showing the dielectric layer removed where a layer 25 protects a layer 30 during the removal of the dielectric layer in accordance with the present invention.

Referring to FIG. 10, a top view of device 10 is shown after removing cut mask 36. FIG. 11 shows a cross-sectional view taken at section line 11—11 of FIG. 10. Dielectric layer 34 (FIG. 9) is removed from a surface 42. Surface 42 includes oxidation layer 25, which was formed earlier. Oxidation layer 25, which may be about 70 to 90 angstroms thick, protects dielectric layer 30 from being stripped during the removal of layer 34.

Figure 12:
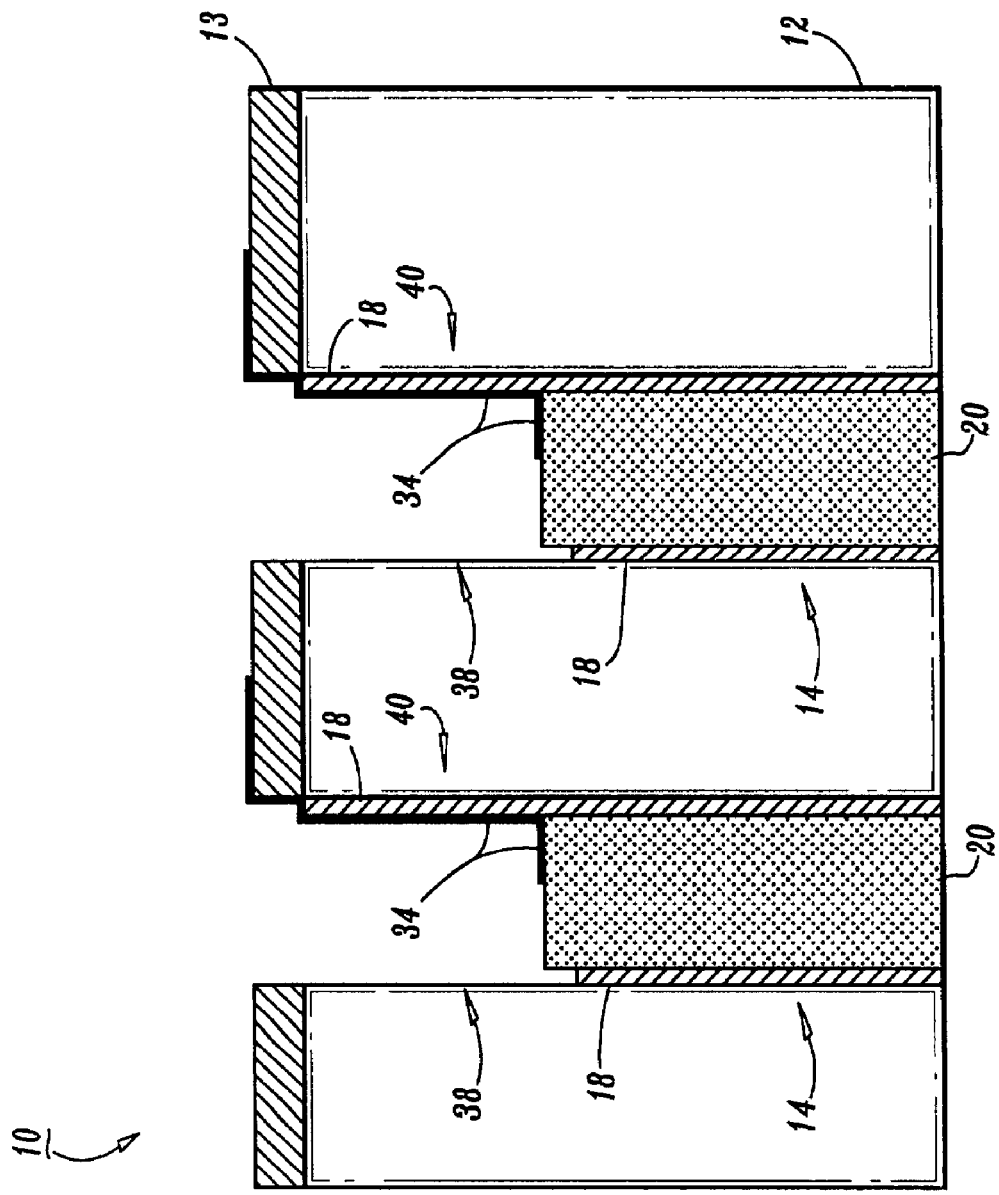
FIG. 12 is a cross-sectional view of the semiconductor device of FIG. 10 showing a single side collar etch in accordance with the present invention.

Referring to FIG. 12, cut mask 36 is removed and collar 18 is etched. Collar 18 is removed on side 38 and not side 40. On side 40, collar 18 is protected by dielectric layer 34. Advantageously, no lateral etching of collar 18 occurs on side 40, and collar 18 is self-aligned to appropriate areas of trench 14. Isolation trench 32 is protected form the collar etch process by dielectric layer 30 (see FIG. 11). Layer 25 is removed by the collar etch process.

Figure 13:
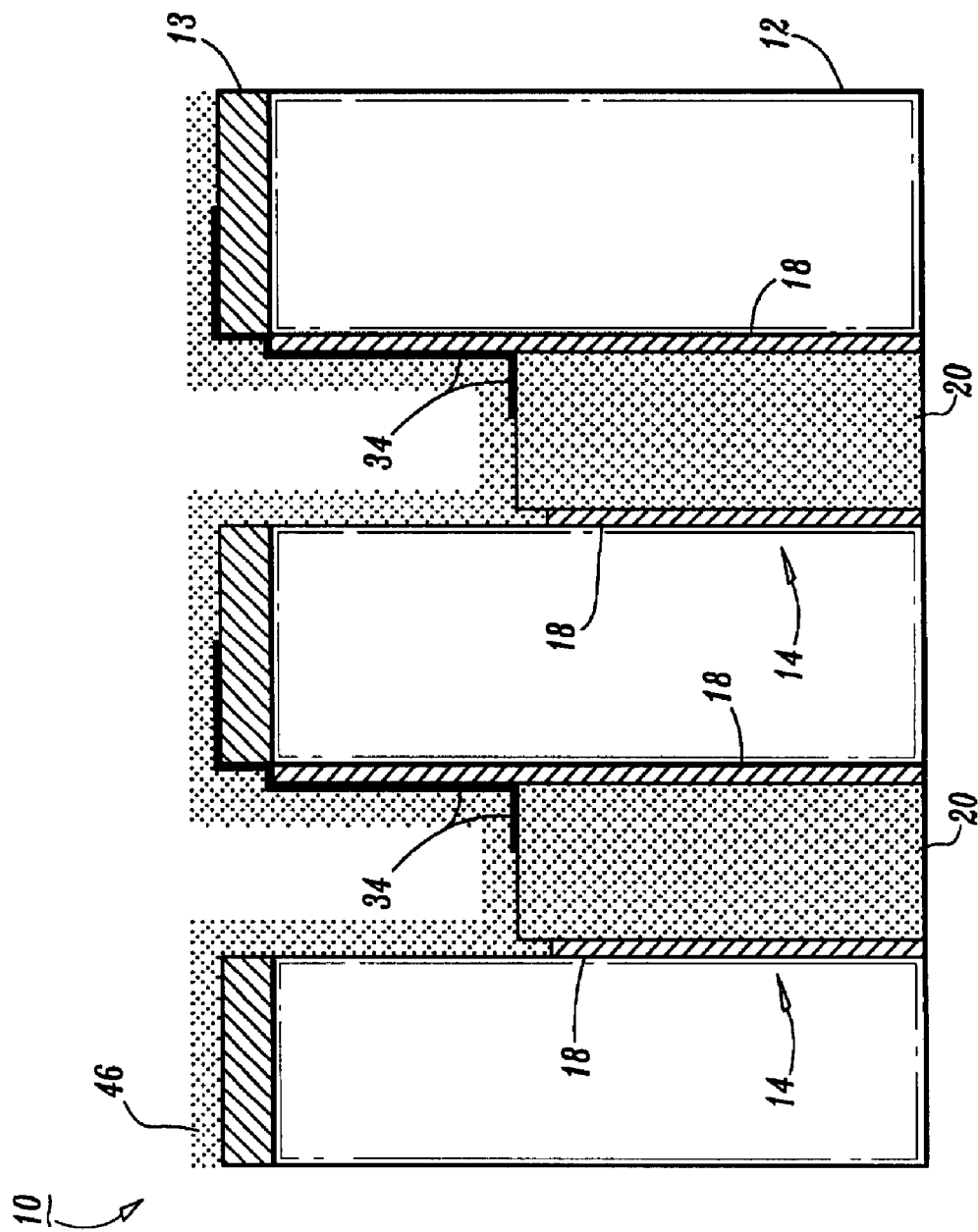
FIG. 13 is a cross-sectional view of the semiconductor device of FIG. 12 showing a conductive layer deposited in accordance with the present invention.
Figure 14:
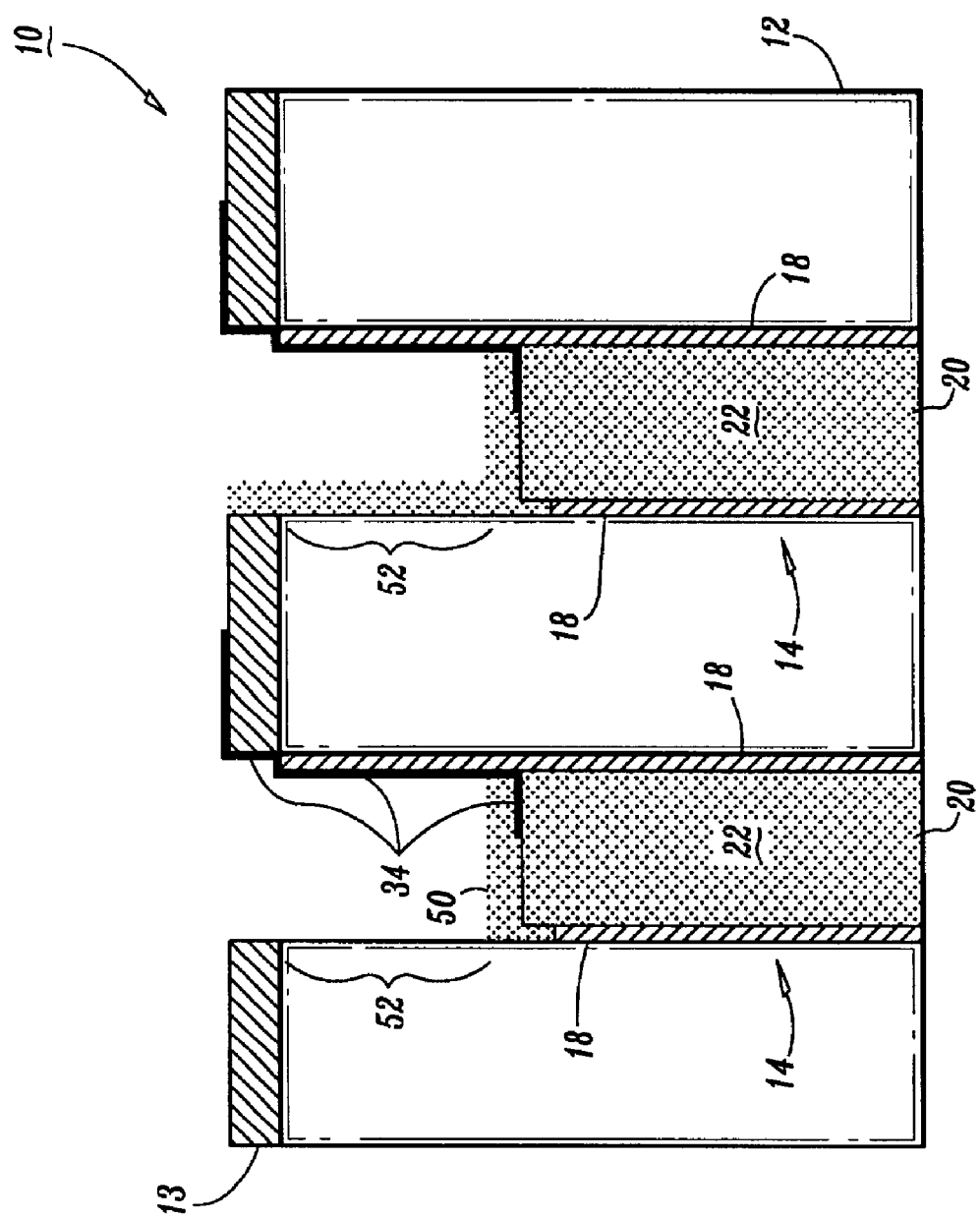
FIG. 14 is a cross-sectional view of the semiconductor device of FIG. 13 showing the conductive layer forming a single-sided buried strap in accordance with the present invention.

Referring to FIG. 13, a conductive layer 46 is deposited in trench 14. Conductive layer 46 preferably includes doped polysilicon. As shown in FIG. 14, a buried strap polysilicon etchback (BSPE) process is performed to form a single-sided buried strap 50 in accordance with the present invention. Buried strap 50 provide a connection point between storage node 22 and a channel region 52 which will be formed in substrate 12. Channel region 52 will be formed into a channel for a vertical transistor (not shown) which will be enabled by a gate formed in an upper portion of trench 14. Processing continues as is known in the art to form vertical transistors and complete device 10.

Figure 15:
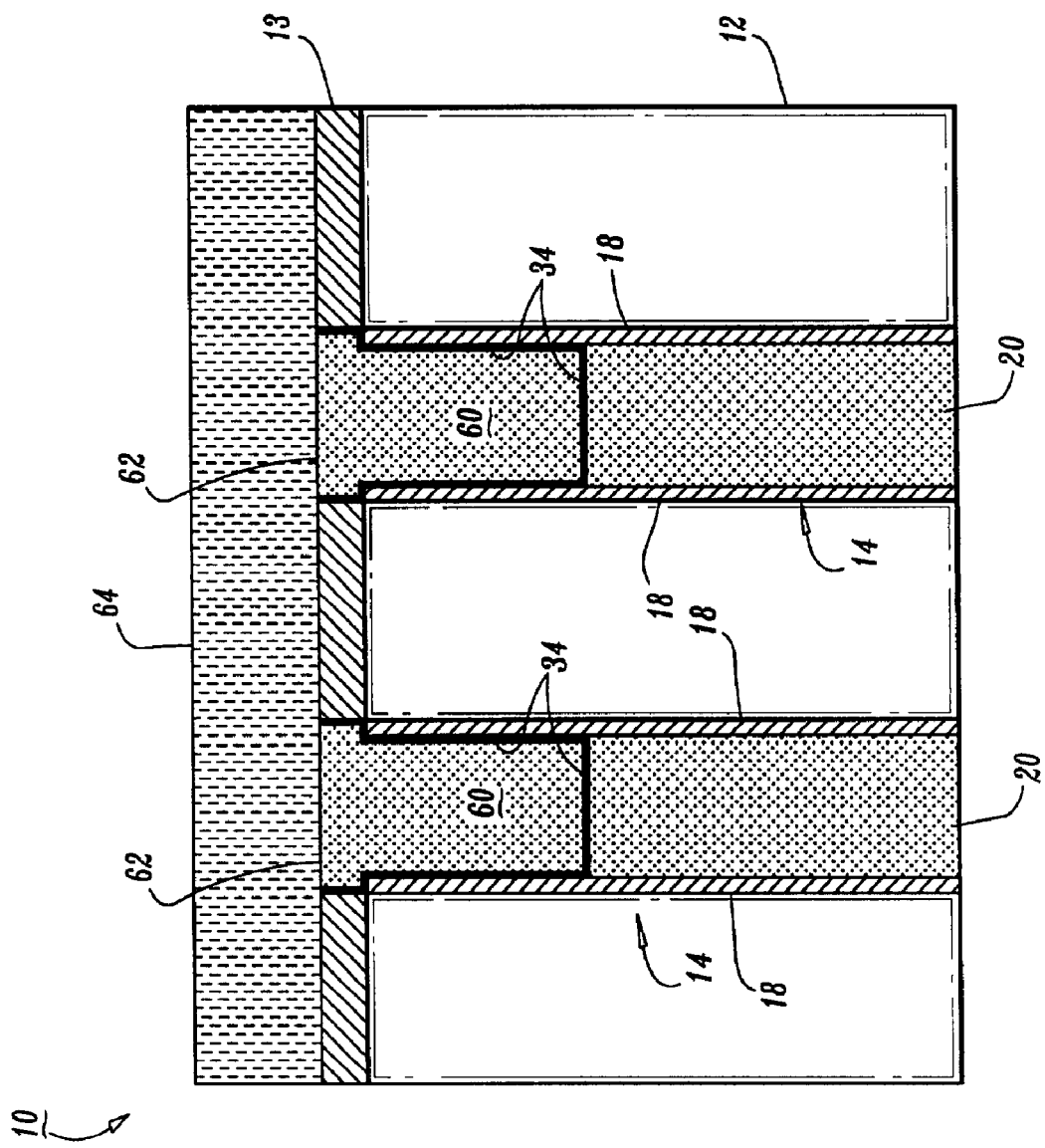
FIG. 15 is a cross-sectional view of a semiconductor device with deep trenches filled, a dielectric layer formed in the deep trenches and an isolation trench mask formed in accordance with another embodiment of the present invention.

Another embodiment of the present invention will now be described. This embodiment preferably includes dopant implantation and oxidation instead of a cut mask. Referring to FIG. 15, a sacrificial material 60 fill is performed to fill trench 14. Material 60 preferably includes polysilicon. Material 60 is planarized to provide a surface 62. This may be performed by a CMP process. An isolation trench mask 64, for example an oxide hardmask, is deposited and lithographically patterned as shown in FIG. 16.

Figure 16:
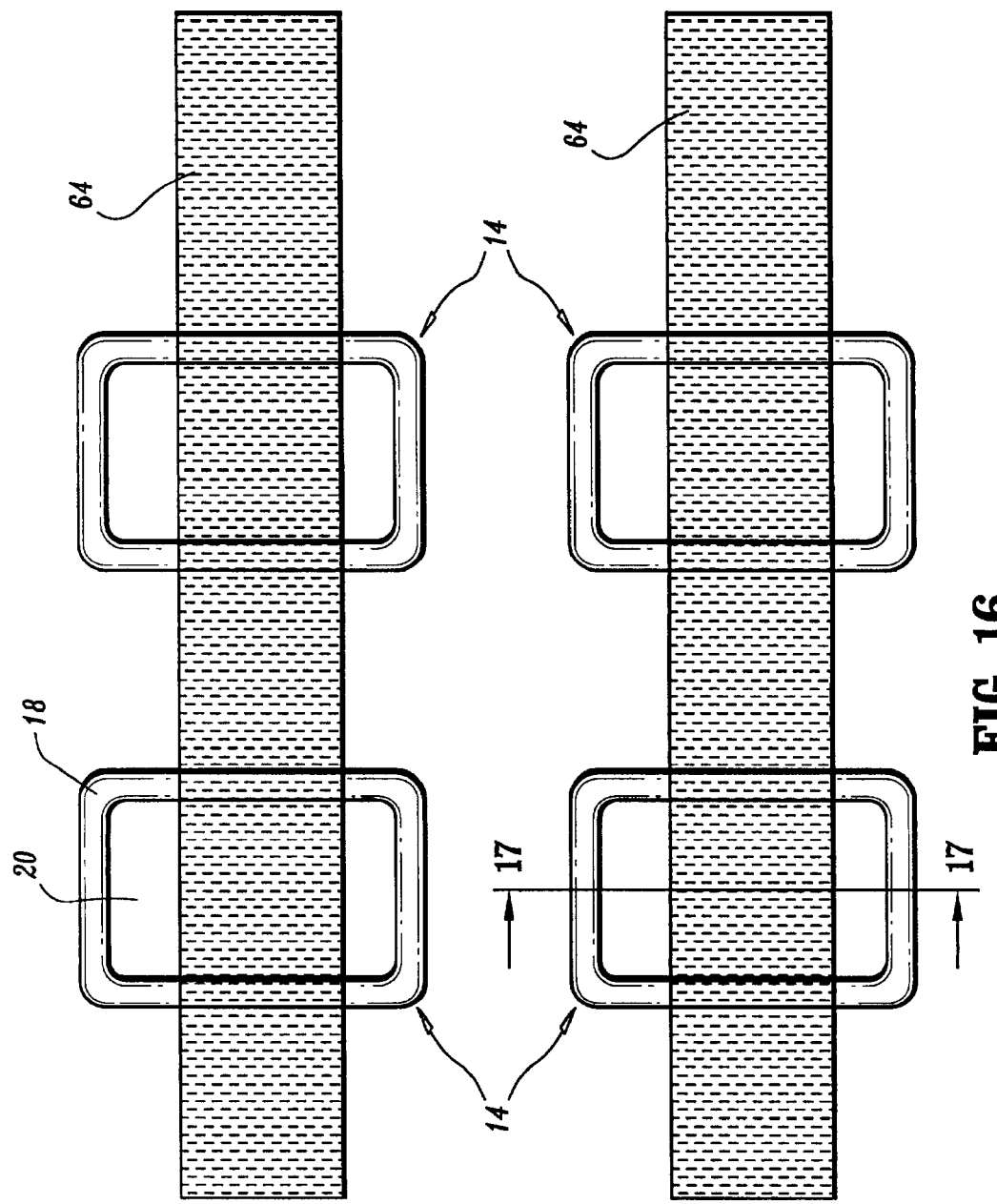
FIG. 16 is a top view of the semiconductor device of FIG. 15 after patterning isolation trench mask in accordance with the present invention.
Figure 17:
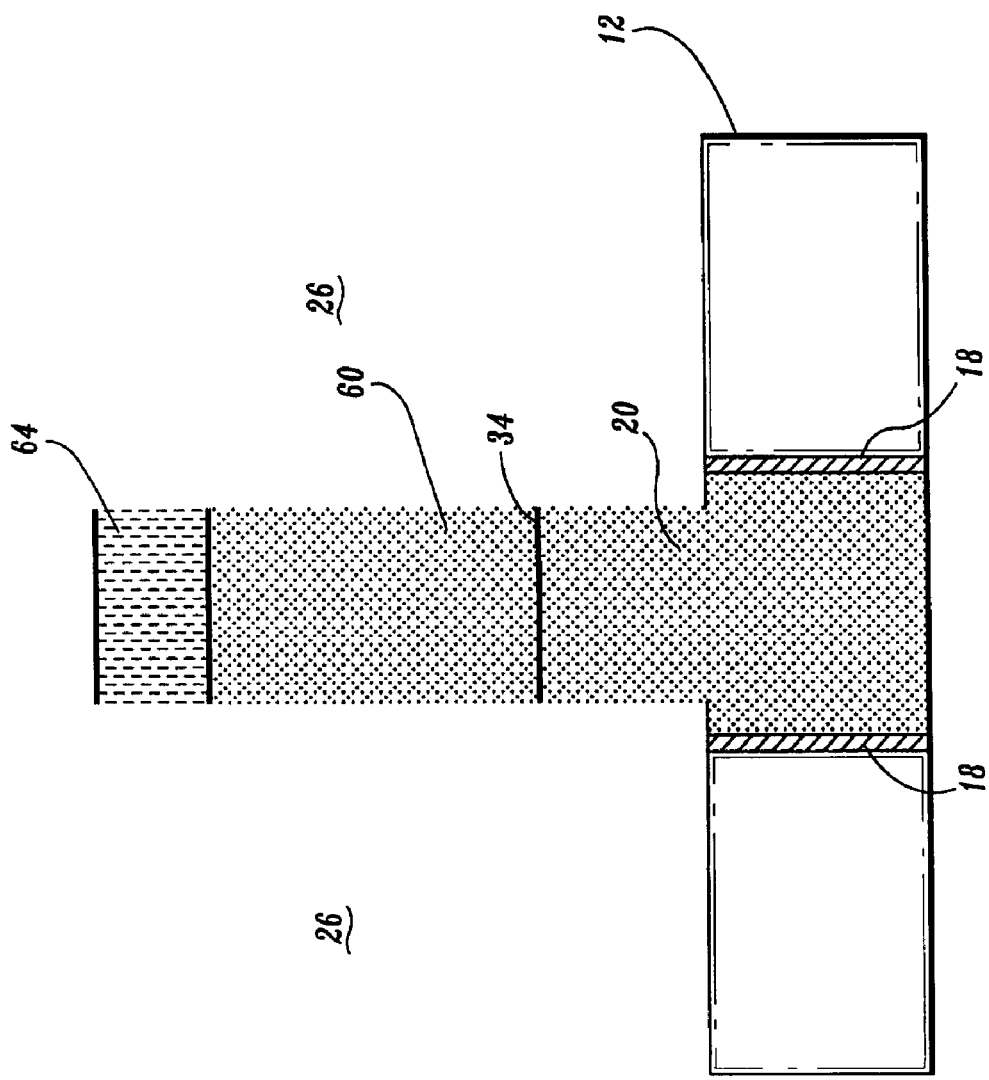
FIG. 17 is a cross-sectional view of the semiconductor device of FIG. 16 taken at section line 17—17 of FIG. 16 showing isolation trenches formed in accordance with the present invention.
Figure 18:
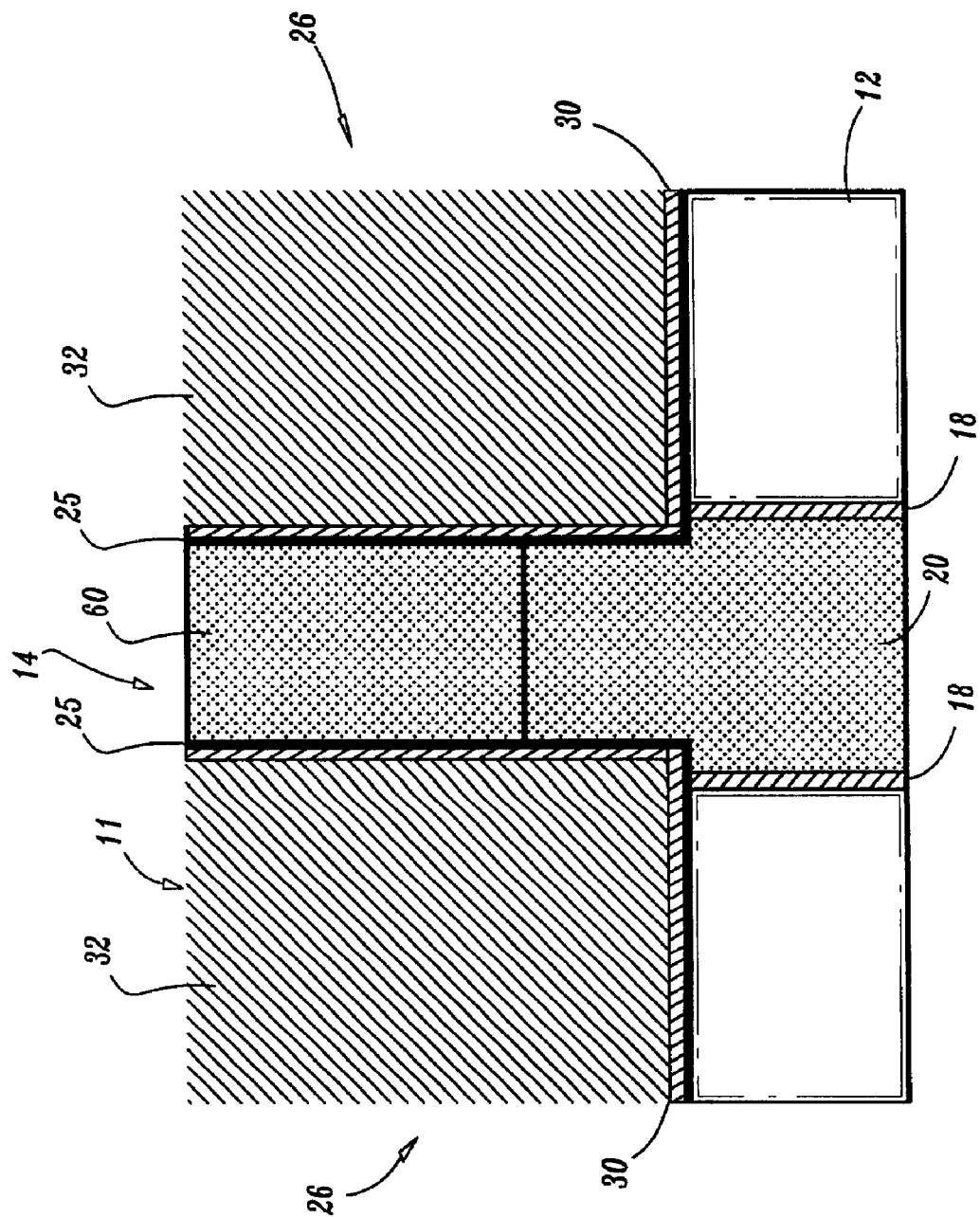
FIG. 18 is a cross-sectional view of the semiconductor device of FIG. 17 after isolation regions are formed in accordance with the present invention.

Referring to FIG. 17, a cross-sectional view taken along section line 17—17 of FIG. 16 is shown after isolation trenches 26 are etched. As shown in FIG. 18, mask 64 is removed and an oxidation process is performed to form an oxide on exposed surfaces of substrate 12 to form an oxidation layer 25. This oxidation layer 25 will be employed in later steps to protect a thin dielectric layer 30 from being etched from inside of trench 14. Dielectric layer 30 is conformally deposited on the walls and bottom of trenches 26 over oxidation layer 25. Dielectric layer 30 preferably includes a nitride. Trenches 26 are filled with a dielectric material, such as a high density plasma (HDP) oxide or the like to form shallow or intermediate trench isolation regions 32 (STI or IT, respectively). A CMP or other planarizing process is employed to planarize the top surface 11 of device 10.

Figure 19:
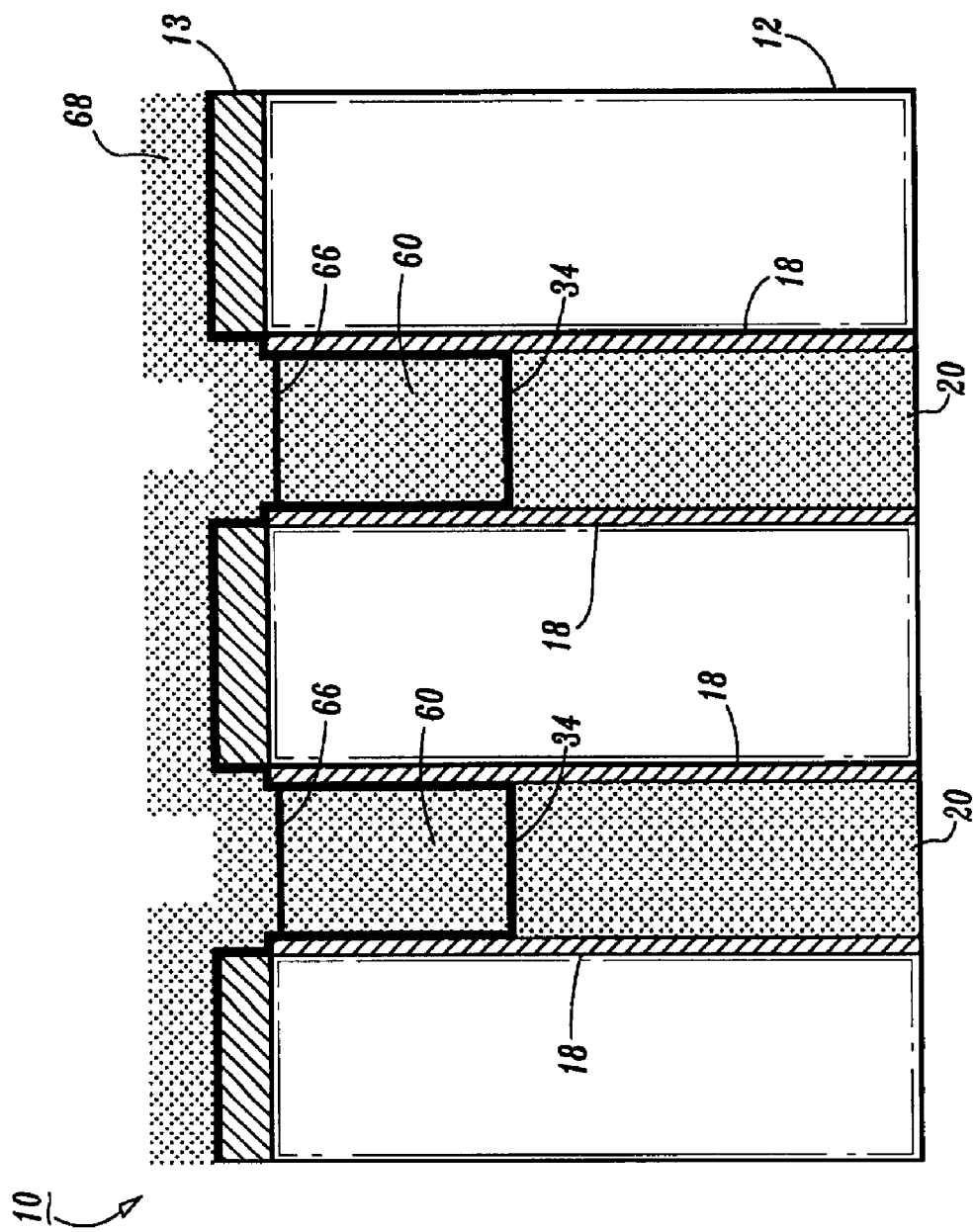
FIG. 19 is a cross-sectional view of the semiconductor device of FIG. 18 showing a dielectric layer and an amorphous polysilicon layer formed in accordance with the present invention.

Referring to FIG. 19, material 60 is recessed into trench 14 by an anisotropic etching process. A thin dielectric layer 66 having a thickness of, for example, between about 2–3 nm is deposited. Dielectric layer 66 preferably includes a nitride layer. An amorphous polysilicon layer 68 is deposited over the surface of device 10.

Figure 20:
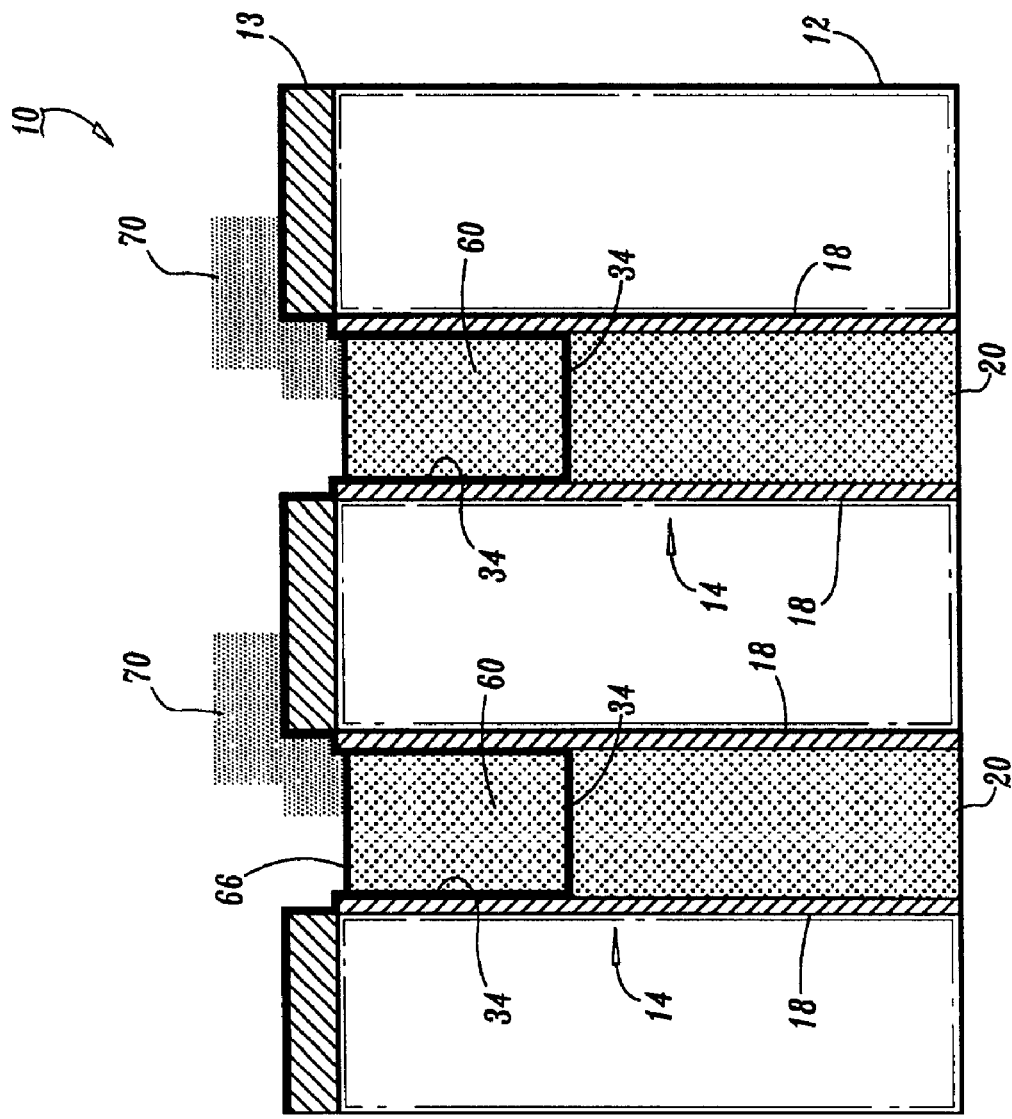
FIG. 20 is a cross-sectional view of the semiconductor device of FIG. 19 showing the amorphous polysilicon layer converted to an etch mask in accordance with the present invention.

Referring to FIG. 20, layer 68 (FIG. 19) is implanted with p or n type dopants, such as, for example, B, $BF_2$, P or As. The implantation is performed at an angle to provide adequate shadowing of material in layer 68 which is directly above a portion of the trench. Undoped portions of layer 68 are then removed by etching, and the remaining portions of layer 68 are oxidized to form a mask 70. This leaves a mask 70 for etching layers therebelow.

Figure 21:
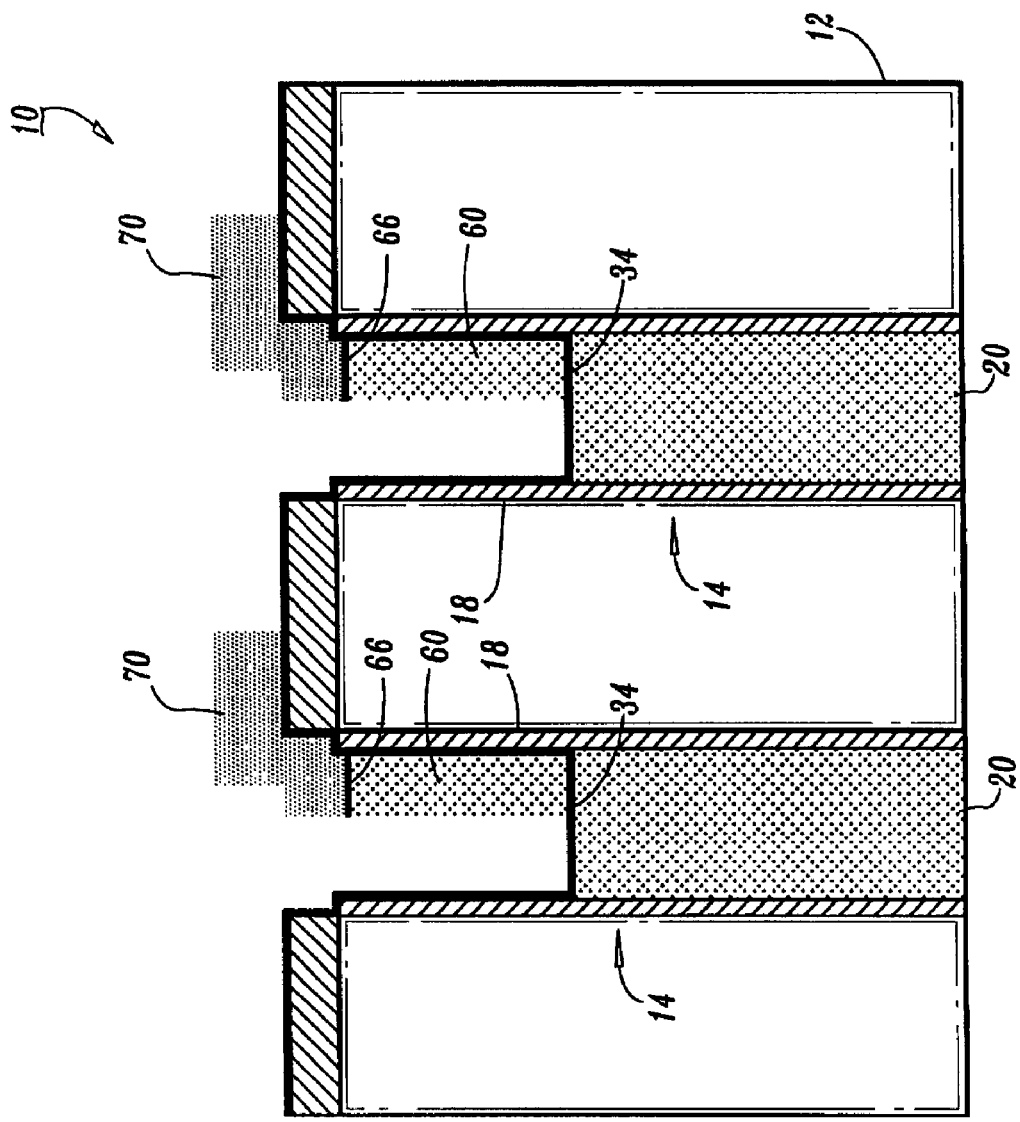
FIG. 21 is a cross-sectional view of the semiconductor device of FIG. 20 showing a filler material in the deep trench removed in accordance with the present invention.
Figure 22:
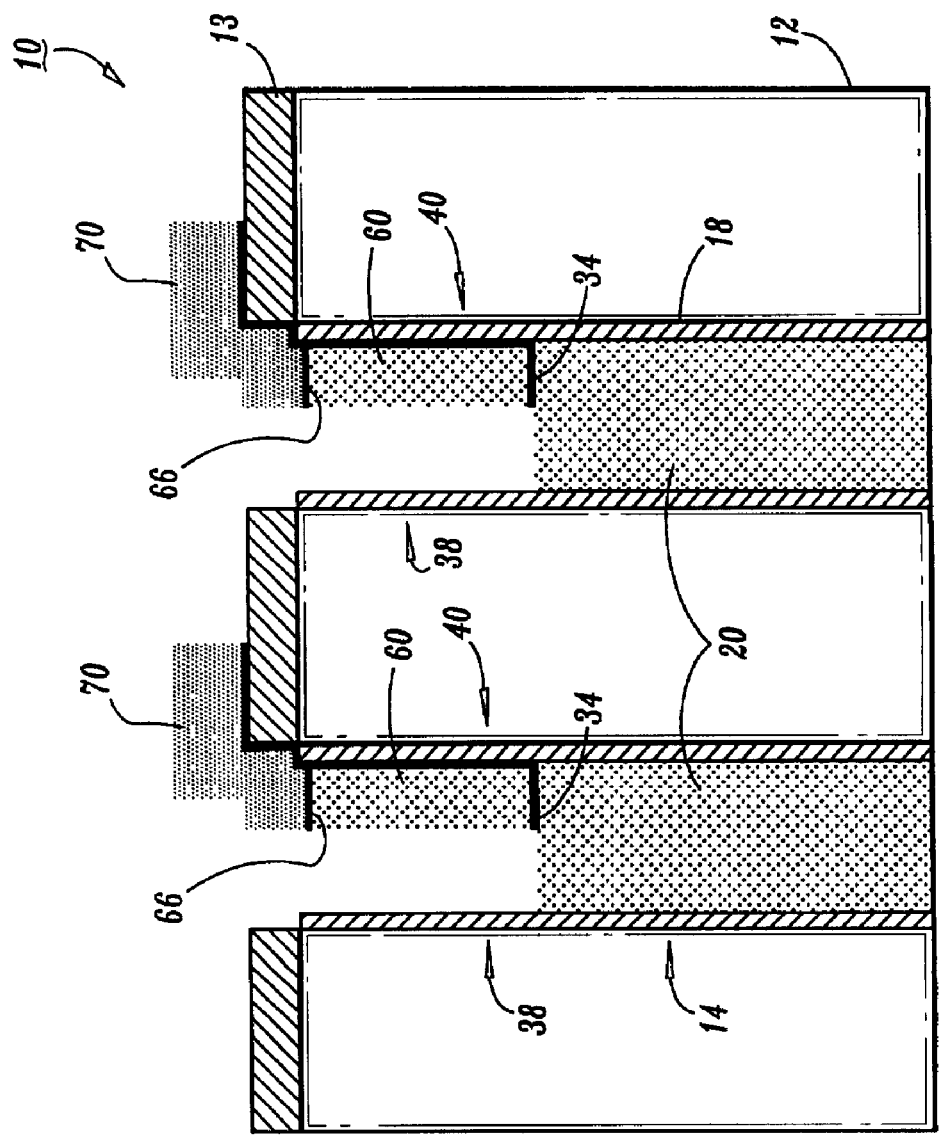
FIG. 22 is a cross-sectional view of the semiconductor device of FIG. 21 showing a dielectric layer, formed in the deep trench, patterned in accordance with the present invention.
Figure 23:
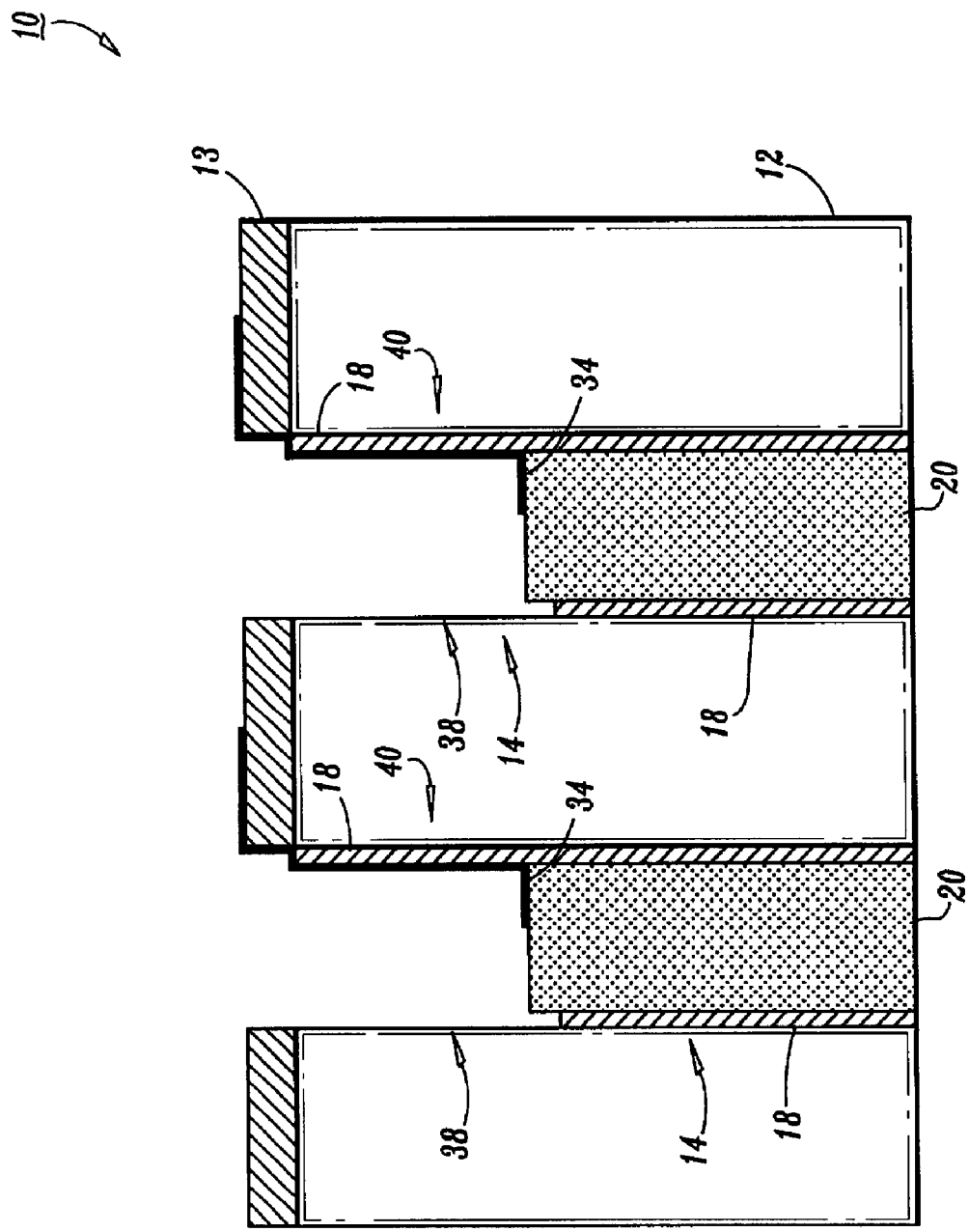
FIG. 23 is a cross-sectional view of the semiconductor device of FIG. 22 showing a single side collar etch in accordance with the present invention.

Referring to FIG. 21, dielectric layer 66 and fill material 60 are removed down to layer 34 by an anisotropic etching processes, such as RIE processes. Dielectric layer 30 (FIG. 16) is protected from being etched inside of trench 14 by oxidation layer 25. As shown in FIG. 22, layer 34 is removed from side 38. Collar 18 is etched from side 38, as shown in FIG. 23. Mask 70 and material 60 are removed from trench 14. Now, a single-sided buried strap is formed by a buried strap conductor deposition and etch back as described above, and processing continues as is known in the art.

In a non-self-aligned scheme, the width of the collar must exceed a width dimension of an active area region to ensure lateral isolation. In other words, a sufficient amount of collar insulation must be present to ensure the sides of the trench are isolated from the regions outside the trench. The width of the collar in the non-self-aligned case must be large enough to account for misalignment tolerances between the active area (AA) region and the trench. Advantageously, in the self-aligned methods of the present invention, the collar width may be made exactly equal to the AA width and still provide good isolation. Since self-alignment is provided, the size of the collar and trench do not need to include larger dimensions to account for misalignment tolerances between the active area (AA) region and the trench.

Figure 24:
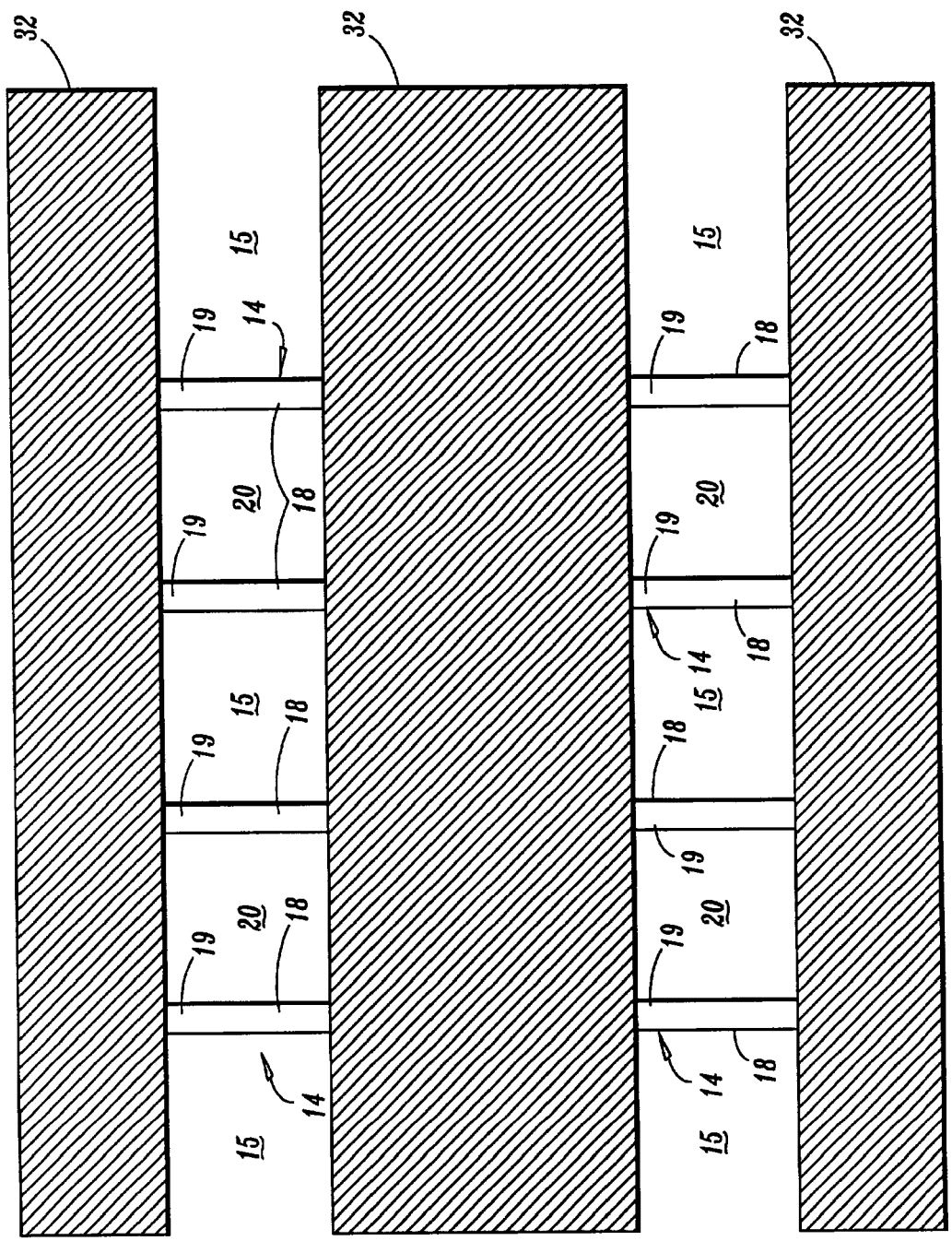
FIG. 24 is a top view of a semiconductor device having a collar recessed on opposite sides of a trench to form two self-aligned buried straps in accordance with the present invention.

Taking advantage of the alignment between active areas and deep trenches, permits additional advantages for the embodiments described above and for other memory cell designs. Referring to FIG. 24, a top view of a semiconductor device 200 is shown in accordance with another embodiment of the present invention. For device 200, buried straps are needed on both sides of trench 14. Collar 18 is recessed in regions 19 to permit access to material 20 in each trench 14 from active areas 15. Advantageously, collar 18 shares a same width dimension (e.g., regions 19) as active areas 15 and provides good isolation in remaining areas (regions of collar outside regions 19 and below STI region 32). These advantages are also applicable to the embodiments described above.

Having described preferred embodiments for self-aligned collar and strap formation for semiconductor devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for fabricating a buried strap, comprising the steps of:
   forming a dielectric collar along sidewalls of a trench, the trench formed in a substrate;
   filling the trench with a conductive material;
   recessing the conductive material in the trench to expose a portion of the collar;
   depositing a masking layer in the trench over the exposed portion of the collar;
   removing a portion of the masking layer over one side of the collar;
   etching a portion of the collar on the one side; and
   forming a buried strap on the conductive material, which connects to the substrate on the one side.

2. The method as recited in claim 1, wherein the masking layer includes nitride.

3. The method as recited in claim 1, wherein the step of removing a portion of the masking layer includes patterning a cut mask for etching the masking layer.

4. The method as recited in claim 1, wherein the step of removing a portion of the masking layer includes the steps of:
   forming a polysilicon layer over the trench;
   doping and oxidizing the polysilicon layer in areas;
   removing the polysilicon layer in other than the areas; and
   etching the masking layer in accordance with the areas.

5. The method as recited in claim 1, further comprising the step of forming isolation trenches in communication with the trench.

6. The method as recited in claim 5, further comprising the steps of:
   oxidizing surfaces within the isolation trenches;
   lining the isolation trenches with a nitride layer;
   filling the isolation trenches with a dielectric material.

7. The method as recited in claim 6, further comprising the steps of:
   protecting portions of the nitride layer in communication with the trench during the step of removing a portion of the masking layer by employing surfaces oxidized in the step of oxidizing surfaces.

8. The method as recited in claim 6, wherein the step of oxidizing surfaces includes forming an oxide between about 70 angstroms to about 90 angstroms in thickness.

9. The method as recited in claim 1, wherein the step of forming a buried strap includes the steps of:
   depositing a buried strap conductor in the trench; and
   etching back the buried strap conductor.

10. A method for fabricating a one-sided buried strap, comprising the steps of:
    forming a dielectric collar along sidewalls of a trench, the trench formed in a substrate;
    filling the trench with a conductive material;
    etching isolation trenches in communication with the trench;
    oxidizing surfaces within the isolation trenches;
    lining the isolation trenches with a nitride layer;
    filling the isolation trenches with a dielectric material;
    recessing the conductive material in the trench to expose a portion of the collar;
    depositing a masking layer in the trench over the exposed portion of the collar;
    removing a portion of the masking layer over one side of the collar;
    etching a portion of the collar on the one side; and
    forming a buried strap on the one side.

11. The method as recited in claim 10, wherein the masking layer includes nitride.

12. The method as recited in claim 10, wherein the step of removing a portion of the masking layer includes patterning a cut mask for etching the masking layer.

13. The method as recited in claim 10, wherein the step of removing a portion of the masking layer includes the steps of:
    forming a polysilicon layer over the trench;
    doping and oxidizing the polysilicon layer in areas;
    removing the polysilicon layer in other than the areas; and
    etching the masking layer in accordance with the areas.

14. The method as recited in claim 10, further comprising the steps of:
    protecting portions of the nitride layer in communication with the trench during the step of removing a portion of the masking layer by employing surfaces oxidized in the step of oxidizing surfaces.

15. The method as recited in claim 10, wherein the step of oxidizing surfaces includes forming an oxide between about 70 angstroms to about 90 angstroms in thickness.

16. The method as recited in claim 10, wherein the step of forming a buried strap includes the steps of:
    depositing a buried strap conductor in the trench; and
    etching back the buried strap conductor.

* * * * *